(12) United States Patent
Takeda et al.

(10) Patent No.: US 11,784,030 B2
(45) Date of Patent: *Oct. 10, 2023

(54) PLASMA PROCESSING APPARATUS

(71) Applicant: Canon Anelva Corporation, Kawasaki (JP)

(72) Inventors: Atsushi Takeda, Yokohama (JP); Takayuki Moriwaki, Hino (JP); Tadashi Inoue, Sagamihara (JP); Masaharu Tanabe, Fuchu (JP); Kazunari Sekiya, Hachioji (JP); Hiroshi Sasamoto, Tachikawa (JP); Tatsunori Sato, Hachioji (JP); Nobuaki Tsuchiya, Hamura (JP)

(73) Assignee: CANON ANELVA CORPORATION, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/932,400

(22) Filed: Sep. 15, 2022

(65) Prior Publication Data

US 2023/0005721 A1 Jan. 5, 2023

Related U.S. Application Data

(63) Continuation of application No. 16/720,156, filed on Dec. 19, 2019, now Pat. No. 11,600,469, which is a
(Continued)

(30) Foreign Application Priority Data

| Jun. 27, 2017 | (WO) | PCT/JP2017/023603 |
| Jun. 27, 2017 | (WO) | PCT/JP2017/023611 |
| Feb. 2, 2018 | (JP) | 2018-017548 |

(51) Int. Cl.
*H01J 37/32* (2006.01)
*H01J 37/18* (2006.01)

(52) U.S. Cl.
CPC ........ *H01J 37/32541* (2013.01); *H01J 37/18* (2013.01); *H01J 37/3255* (2013.01);
(Continued)

(58) Field of Classification Search
None
See application file for complete search history.

(56) References Cited

U.S. PATENT DOCUMENTS

| 4,014,779 A | 3/1977 | Kuehnle |
| 4,025,339 A | 5/1977 | Kuehnle |

(Continued)

FOREIGN PATENT DOCUMENTS

| CN | 1155748 A | 7/1997 |
| CN | 1220931 A | 6/1999 |

(Continued)

OTHER PUBLICATIONS

Notification of the First Office Action issued in Chinese Patent Application No. 201880094963.9, dated Oct. 10, 2022, with English Translation (33 pages).
(Continued)

*Primary Examiner* — Srinivas Sathiraju
(74) *Attorney, Agent, or Firm* — BUCHANAN INGERSOLL & ROONEY PC

(57) ABSTRACT

A plasma processing apparatus includes a balun having a first unbalanced terminal, a second unbalanced terminal, a first balanced terminal, and a second balanced terminal, a grounded vacuum container, a first electrode electrically connected to the first balanced terminal, a second electrode electrically connected to the second balanced terminal, and a ground electrode arranged in the vacuum container and grounded.

17 Claims, 25 Drawing Sheets

Related U.S. Application Data continuation of application No. PCT/JP2018/024154, filed on Jun. 26, 2018.

(52) U.S. Cl.
CPC ... *H01J 37/32449* (2013.01); *H01J 2237/327* (2013.01); *H01J 2237/334* (2013.01)

(56) References Cited

U.S. PATENT DOCUMENTS

| | | | |
|---|---|---|---|
| 4,131,533 A | 12/1978 | Bialko et al. | |
| 4,170,475 A | 10/1979 | Hagenlocher et al. | |
| 4,284,489 A * | 8/1981 | Weber | H01J 37/32174 |
| | | | 315/276 |
| 4,284,490 A | 8/1981 | Weber | |
| 4,584,079 A * | 4/1986 | Lee | C23C 14/34 |
| | | | 257/776 |
| 4,802,080 A * | 1/1989 | Bossi | G06K 19/0715 |
| | | | 363/90 |
| 4,871,421 A | 10/1989 | Ogle et al. | |
| 4,887,005 A * | 12/1989 | Rough | H01J 37/32174 |
| | | | 422/906 |
| 4,956,582 A * | 9/1990 | Bourassa | H05H 1/46 |
| | | | 315/111.21 |
| 5,121,067 A * | 6/1992 | Marsland | H01L 27/0605 |
| | | | 257/E27.012 |
| 5,147,493 A | 9/1992 | Nishimura et al. | |
| 5,169,509 A * | 12/1992 | Latz | H01J 37/32449 |
| | | | 204/298.18 |
| 5,316,645 A | 5/1994 | Yamagami et al. | |
| 5,330,578 A | 7/1994 | Sakama et al. | |
| 5,415,757 A | 5/1995 | Szczyrbowski et al. | |
| 5,464,499 A | 11/1995 | Moslehi et al. | |
| 5,611,899 A | 3/1997 | Maass | |
| 5,698,082 A | 12/1997 | Teschner et al. | |
| 5,718,815 A | 2/1998 | Szczyrbowski et al. | |
| 5,733,511 A | 3/1998 | De | |
| 5,755,938 A | 5/1998 | Fukui et al. | |
| 5,803,973 A | 9/1998 | Szczyrbowski et al. | |
| 5,807,470 A * | 9/1998 | Szczyrbowski | H01J 37/3444 |
| | | | 204/192.12 |
| 5,830,331 A | 11/1998 | Kim et al. | |
| 5,865,969 A | 2/1999 | Clarke | |
| 5,932,116 A | 8/1999 | Matsumoto et al. | |
| 5,989,999 A * | 11/1999 | Levine | C23C 16/5096 |
| | | | 438/653 |
| 5,990,016 A | 11/1999 | Kim et al. | |
| 6,017,221 A * | 1/2000 | Flamm | H01J 37/321 |
| | | | 204/192.32 |
| 6,046,641 A | 4/2000 | Chawla et al. | |
| 6,096,174 A | 8/2000 | Teschner et al. | |
| 6,150,826 A | 11/2000 | Hokodate et al. | |
| 6,239,404 B1 | 5/2001 | Lea et al. | |
| 6,252,354 B1 * | 6/2001 | Collins | H01J 37/32174 |
| | | | 156/345.28 |
| 6,273,022 B1 | 8/2001 | Pu et al. | |
| 6,422,172 B1 | 7/2002 | Tanaka et al. | |
| 6,517,912 B1 | 2/2003 | Morfill et al. | |
| 6,568,346 B2 | 5/2003 | Pu et al. | |
| 6,703,080 B2 | 3/2004 | Reyzelman et al. | |
| 6,818,103 B1 | 11/2004 | Scholl et al. | |
| 6,825,618 B2 | 11/2004 | Pu et al. | |
| 6,876,205 B2 | 4/2005 | Walde et al. | |
| 6,885,154 B2 | 4/2005 | Uchida et al. | |
| 6,913,703 B2 | 7/2005 | Strang et al. | |
| 7,032,536 B2 | 4/2006 | Fukuoka et al. | |
| 7,298,091 B2 | 11/2007 | Pickard et al. | |
| 7,445,690 B2 | 11/2008 | Kasai et al. | |
| 7,586,210 B2 | 9/2009 | Wiedemuth et al. | |
| 7,670,455 B2 | 3/2010 | Keller et al. | |
| 7,777,567 B2 | 8/2010 | Polizzo | |
| 8,033,246 B2 | 10/2011 | Wiedemuth et al. | |
| 8,293,068 B2 | 10/2012 | Koshimizu et al. | |
| 8,450,635 B2 | 5/2013 | Dhindsa et al. | |
| 8,647,585 B2 * | 2/2014 | Hancock | A61N 5/022 |
| | | | 422/186.04 |
| 8,932,430 B2 | 1/2015 | Srivastava et al. | |
| 8,992,723 B2 | 3/2015 | Sorensen et al. | |
| 9,039,864 B2 | 5/2015 | Baek et al. | |
| 9,121,786 B2 | 9/2015 | Tie | |
| 9,147,555 B2 | 9/2015 | Richter | |
| 9,245,776 B2 | 1/2016 | Himori et al. | |
| 9,401,265 B2 | 7/2016 | Michel et al. | |
| 9,455,126 B2 * | 9/2016 | Valcore, Jr. | H01J 37/32082 |
| 9,564,360 B2 | 2/2017 | Akasaka et al. | |
| 9,607,810 B2 * | 3/2017 | Valcore, Jr. | H01J 37/32981 |
| 9,620,337 B2 * | 4/2017 | Valcore, Jr. | G01R 31/40 |
| 9,640,367 B2 | 5/2017 | Keller et al. | |
| 9,675,716 B2 * | 6/2017 | Hancock | A61N 5/022 |
| 9,779,196 B2 * | 10/2017 | Valcore, Jr. | G06F 30/36 |
| 9,875,861 B2 | 1/2018 | Ergin et al. | |
| 9,875,881 B2 | 1/2018 | Nagami et al. | |
| 10,081,869 B2 | 9/2018 | Augustyniak et al. | |
| 10,083,817 B1 | 9/2018 | Godyak | |
| 10,157,729 B2 * | 12/2018 | Valcore, Jr. | H01J 37/32082 |
| RE47,276 E | 3/2019 | Benjamin | |
| 10,224,463 B2 | 3/2019 | Daigo | |
| 10,231,321 B2 * | 3/2019 | Valcore, Jr | H05H 1/46 |
| 10,354,838 B1 * | 7/2019 | Mopidevi | H01L 21/6831 |
| 10,410,889 B2 | 9/2019 | Sadjadi et al. | |
| 10,544,505 B2 | 1/2020 | Yang et al. | |
| 10,553,406 B2 | 2/2020 | Chang et al. | |
| 10,685,810 B2 * | 6/2020 | Mopidevi | H01J 37/3211 |
| 10,879,043 B2 * | 12/2020 | Selmo | H01J 37/32174 |
| 11,013,075 B2 | 5/2021 | Lester et al. | |
| 11,114,287 B2 | 9/2021 | Harris et al. | |
| 11,170,991 B2 | 11/2021 | Sakane | |
| 11,315,765 B2 | 4/2022 | Yamawaku et al. | |
| 11,348,762 B2 * | 5/2022 | Morii | H01J 37/32183 |
| 11,596,309 B2 * | 3/2023 | Oliveti | H01J 37/32183 |
| 11,600,469 B2 * | 3/2023 | Takeda | C23C 14/34 |
| 11,626,270 B2 * | 4/2023 | Inoue | H01J 37/32577 |
| | | | 315/111.21 |
| 2001/0054383 A1 | 12/2001 | Pu et al. | |
| 2002/0022836 A1 | 2/2002 | Goble et al. | |
| 2003/0087044 A1 | 5/2003 | Willms et al. | |
| 2003/0215373 A1 | 11/2003 | Reyzelman et al. | |
| 2004/0222184 A1 | 11/2004 | Hayami et al. | |
| 2004/0262156 A1 | 12/2004 | Seymour et al. | |
| 2005/0136604 A1 | 6/2005 | Al-bayati et al. | |
| 2005/0138577 A1 | 6/2005 | Adamian | |
| 2005/0160987 A1 | 7/2005 | Kasai et al. | |
| 2006/0032738 A1 | 2/2006 | Wiedemuth | |
| 2008/0050537 A1 | 2/2008 | Godyak | |
| 2008/0258411 A1 * | 10/2008 | Miura | H01L 21/67109 |
| | | | 279/128 |
| 2008/0308041 A1 | 12/2008 | Koshiishi et al. | |
| 2009/0041640 A1 | 2/2009 | Kasai et al. | |
| 2009/0075597 A1 | 3/2009 | Degani et al. | |
| 2009/0085597 A1 | 4/2009 | Burns et al. | |
| 2009/0102385 A1 | 4/2009 | Wi | |
| 2009/0117707 A1 | 5/2009 | Shimomura et al. | |
| 2009/0242135 A1 | 10/2009 | Koshimizu et al. | |
| 2010/0252199 A1 | 10/2010 | Marakhtanov et al. | |
| 2010/0294433 A1 | 11/2010 | Jianhui | |
| 2011/0300694 A1 | 12/2011 | Matsumoto et al. | |
| 2013/0017315 A1 | 1/2013 | Lai et al. | |
| 2013/0105082 A1 | 5/2013 | Melikyan et al. | |
| 2013/0337657 A1 * | 12/2013 | Savas | H01L 21/0217 |
| | | | 118/723 MP |
| 2014/0011365 A1 * | 1/2014 | Yasui | H01L 21/3065 |
| | | | 438/712 |
| 2014/0373783 A1 | 12/2014 | Sawada et al. | |
| 2015/0054405 A1 | 2/2015 | Nettesheim | |
| 2015/0165752 A1 | 6/2015 | Plach et al. | |
| 2015/0170882 A1 | 6/2015 | Yamawaku et al. | |
| 2015/0255258 A1 | 9/2015 | Nozawa et al. | |
| 2016/0240351 A1 | 8/2016 | Burgess et al. | |
| 2016/0289837 A1 * | 10/2016 | Savas | C23C 16/509 |
| 2016/0307743 A1 * | 10/2016 | Brown | H01J 37/32651 |
| 2016/0336084 A1 | 11/2016 | Laguardia et al. | |
| 2017/0018401 A1 | 1/2017 | Rudolph | |
| 2017/0084432 A1 | 3/2017 | Valcore et al. | |

(56) References Cited

U.S. PATENT DOCUMENTS

| | | | |
|---|---|---|---|
| 2017/0213734 | A9 | 7/2017 | Marakhtanov et al. |
| 2017/0232122 | A1 | 8/2017 | Hancock |
| 2018/0082821 | A1* | 3/2018 | Ikeda ............... H01J 37/32183 |
| 2018/0130640 | A1 | 5/2018 | Gregor et al. |
| 2018/0226227 | A1* | 8/2018 | Donnelly .......... H01J 37/32045 |
| 2018/0269035 | A1* | 9/2018 | Selmo ............... H01J 37/32174 |
| 2018/0318459 | A1 | 11/2018 | Hancock et al. |
| 2019/0108976 | A1* | 4/2019 | Van Zyl ............ H01J 37/32174 |
| 2019/0221405 | A1 | 7/2019 | Yamawaku et al. |
| 2019/0237300 | A1* | 8/2019 | Ikeda ............... H01J 37/32192 |
| 2020/0126763 | A1* | 4/2020 | Sekiya ................ H01L 21/3065 |
| 2020/0126764 | A1* | 4/2020 | Inoue ............... H01J 37/32715 |
| 2020/0126766 | A1* | 4/2020 | Sekiya .................... C23C 14/34 |
| 2020/0126767 | A1* | 4/2020 | Takeda ..................... H01J 37/18 |
| 2020/0126768 | A1* | 4/2020 | Inoue ....................... H01J 37/18 |
| 2020/0161096 | A1 | 5/2020 | Chang et al. |
| 2021/0005429 | A1 | 1/2021 | Tanabe et al. |
| 2021/0118649 | A1 | 4/2021 | Huh et al. |
| 2022/0051878 | A1 | 2/2022 | Sekiya et al. |
| 2023/0005721 | A1* | 1/2023 | Takeda ............... H01J 37/32174 |

FOREIGN PATENT DOCUMENTS

| | | |
|---|---|---|
| CN | 1390436 A | 1/2003 |
| CN | 2907173 Y | 5/2007 |
| CN | 101425456 A | 5/2009 |
| CN | 101478857 A | 7/2009 |
| CN | 101546697 A | 9/2009 |
| CN | 102479657 A | 5/2012 |
| CN | 103091042 A | 5/2013 |
| CN | 103094042 A | 5/2013 |
| CN | 104024471 A | 9/2014 |
| CN | 105887050 A | 8/2016 |
| CN | 106024568 A | 10/2016 |
| DE | 19713637 A1 | 10/1998 |
| EP | 1748687 A1 | 1/2007 |
| JP | S53141937 U | 11/1978 |
| JP | S55035465 B2 | 9/1980 |
| JP | S62133065 A | 6/1987 |
| JP | H02501608 A | 5/1990 |
| JP | H02156080 A | 6/1990 |
| JP | H02156081 A | 6/1990 |
| JP | H02156082 A | 6/1990 |
| JP | H02156083 A | 6/1990 |
| JP | H04317325 A | 11/1992 |
| JP | H10261621 A | 9/1998 |
| JP | H11307299 A | 11/1999 |
| JP | 2000030896 A | 1/2000 |
| JP | 2000195851 A | 7/2000 |
| JP | 2000294543 A | 10/2000 |
| JP | 2001122690 A | 5/2001 |
| JP | 2001181848 A | 7/2001 |
| JP | 2001518230 A | 10/2001 |
| JP | 2002004040 A | 1/2002 |
| JP | 2002118101 A | 4/2002 |
| JP | 2002141292 A | 5/2002 |
| JP | 2003512526 A | 4/2003 |
| JP | 2003155556 A | 5/2003 |
| JP | 2005026540 A | 1/2005 |
| JP | 2005130376 A | 5/2005 |
| JP | 2005303257 A | 10/2005 |
| JP | 2006336084 A | 12/2006 |
| JP | 2008294465 A | 12/2008 |
| JP | 2008300322 A | 12/2008 |
| JP | 2009021634 A | 1/2009 |
| JP | 2009105030 A | 5/2009 |
| JP | 2009302566 A | 12/2009 |
| JP | 2010045664 A | 2/2010 |
| JP | 2010109157 A | 5/2010 |
| JP | 2010255061 A | 11/2010 |
| JP | 2011138907 A | 7/2011 |
| JP | 2011144450 A | 7/2011 |
| JP | 4909523 B2 | 4/2012 |
| JP | 2012142332 A | 7/2012 |
| JP | 2012174682 A | 9/2012 |
| JP | 2013139642 A | 7/2013 |
| JP | 2014049541 A | 3/2014 |
| JP | 2015115216 A | 6/2015 |
| JP | 5824072 B2 | 10/2015 |
| JP | 2016225376 A | 12/2016 |
| JP | 2017211144 A | 11/2017 |
| JP | 6280677 B1 | 2/2018 |
| JP | 6309683 B1 | 4/2018 |
| KR | 10-2014-0135202 A | 11/2014 |
| TW | 200741794 A | 11/2007 |
| TW | 201311059 A | 3/2013 |
| TW | 201423827 A | 6/2014 |
| TW | I492294 B | 7/2015 |
| TW | 201532220 A | 8/2015 |
| TW | 201643932 A | 12/2016 |
| TW | I560767 B | 12/2016 |
| TW | I575107 B | 3/2017 |
| TW | I601309 B | 10/2017 |
| WO | 8902695 A1 | 3/1989 |
| WO | 0129273 A1 | 4/2001 |
| WO | 0129278 A1 | 4/2001 |
| WO | 0137619 A1 | 5/2001 |
| WO | 2010024128 A1 | 3/2010 |
| WO | 2010041679 A1 | 4/2010 |
| WO | 2012095961 A1 | 7/2012 |
| WO | 2019004191 A1 | 1/2019 |

OTHER PUBLICATIONS

International Search Report (PCT/ISA/210) and translation and Written Opinion (PCT/ISA/237) dated Sep. 11, 2018, by the Japanese Patent Office as the International Searching Authority for International Application No. PCT/JP2018/024150.

International Search Report (PCT/ISA/210) dated Sep. 4, 2018, by the Japanese Patent Office as the International Searching Authority for International Application No. PCT/JP2018/024154.

Notice of Reason for Refusal issued in corresponding Japanese Patent Application No. 2019-012419, dated Aug. 15, 2022, with English Translation, 14 pages.

Notice of Reason for Refusal issued in corresponding Japanese Patent Application No. 2019-012426, dated Aug. 15, 2022, with English Translation, 8 pages.

Written Opinion (PCT/ISA/237) dated Sep. 4, 2018, by the Japanese Patent Office as the International Searching Authority for International Application No. PCT/JP2018/024154.

Notice of Allowance dated Sep. 20, 2021, by the U.S. Patent and Trademark Office in U.S. Appl. No. 16/720,154.

Co-pending U.S. Appl. No. 17/023,675, filed Sep. 17, 2020.

First Office Action dated Jun. 2, 2021, by the Chinese Patent Office in Chinese Patent Application No. 201880042465, and an English Translation of the Office Action, 23 pages.

First Office Action dated Jun. 2, 2021, by the Chinese Patent Office in Chinese Patent Application No. 201880042477.2, and an English Translation of the Office Action, 20 pages.

First Office Action dated Jun. 2, 2021, by the Chinese Patent Office in Chinese Patent Application No. 201780092518.4, and an English Translation of the Office Action, 21 pages.

First Office Action dated Jun. 2, 2021, by the Chinese Patent Office in Chinese Patent Application No. 201780092519.9, and an English Translation of the Office Action, 23 pages.

Supplemental European Search Report issued in corresponding European Patent Application No. 18823378.7, dated May 25, 2020, 7 pages.

Supplemental European Search Report issued in corresponding European Patent Application No. 18824433, dated Apr. 30, 2020, 8 pages.

Extended European Search Report issued in European Patent Application No. 18 92 4031, dated Feb. 15, 2022, 9 pages. European Patent Application No. 18 92 4031 corresponding to U.S. Appl. No. 17/023,675.

Office Action (Notice of Preliminary Rejection) dated Apr. 19, 2021, by the Korean Patent Office in corresponding Korean Patent Application No. 10-2020-7001366, and an English Translation of the Office Action, 14 pages.

(56) References Cited

OTHER PUBLICATIONS

Office Action (Notice of Preliminary Rejection) dated Apr. 26, 2021, by the Korean Patent Office in corresponding Korean Patent Application No. 10-2020-7001366, and an English Translation of the Office Action, 9 pages.
Office Action (Grant of Patent) dated Apr. 27, 2021, by the Korean Patent Office in corresponding Korean Patent Application No. 10-2020-7001397, and an English Translation of the Office Action, 4 pages.
Non-Final Office Action received for U.S. Appl. No. 16/720,087, dated Apr. 7, 2022, 24 pages.
Office Action Summary dated Jan. 6, 2021, by the U.S. Patent and Trademark Office in U.S. Appl. No. 16/720,154, 27 pages.
Office Action Summary dated Mar. 15, 2021, by the U.S. Patent and Trademark Office in U.S. Appl. No. 16/720,154, 19 pages.
Non-Final Office Action received for U.S. Appl. No. 16/720,154, dated May 26, 2022, 16 pages.
Notice of Allowance received for U.S. Appl. No. 16/720,262, dated May 27, 2022, 8 pages.
Notice of Allowance received for U.S. Appl. No. 17/023,675, dated May 26, 2022, 12 pages.
Non-Final Office Action received for U.S. Appl. No. 16/720,173, dated May 12, 2022, 26 pages.
Office Action dated Sep. 22, 2021, by the U.S. Patent and Trademark Office in U.S. Appl. No. 16/720,262.
Office Action dated Aug. 19, 2021, by the U.S. Patent and Trademark Office in corresponding U.S. Appl. No. 17/023,675.
Final Office Action issued in U.S. Appl. No. 16/720,087, dated Oct. 25, 2022 (36 pages).
Written Decision on Registration issued in Korean Patent Application No. 10-2020-7001366, dated Sep. 23, 2022, with English Translation (6 pages).

\* cited by examiner

FIG. 4

| TOTAL CURRENT I1 | 1 | 1 | 1 | 1 | 1 | 1 | 1 | 1 | 1 | 1 | 1 |
|---|---|---|---|---|---|---|---|---|---|---|---|
| CURRENT I2' | 1 | 0.9999 | 0.9997 | 0.999 | 0.997 | 0.99 | 0.97 | 0.9 | 0.68 | 0.55 | 0.29 |
| CURRENT I3 | 0 | 0.0001 | 0.0003 | 0.001 | 0.003 | 0.01 | 0.03 | 0.1 | 0.32 | 0.45 | 0.71 |
| ISO[dB]= 20log(I3/I2) | $-\infty$ | -80.0 | -70.0 | -60.0 | -50.0 | -40.0 | -30.0 | -20.0 | -10.0 | -7.0 | -3.0 |
| $\alpha$=X/Rp | $\infty$ | 5000 | 1582 | 500 | 158 | 50 | 15.8 | 5.0 | 1.5 | 1.0 | 0.5 |

F I G. 15C
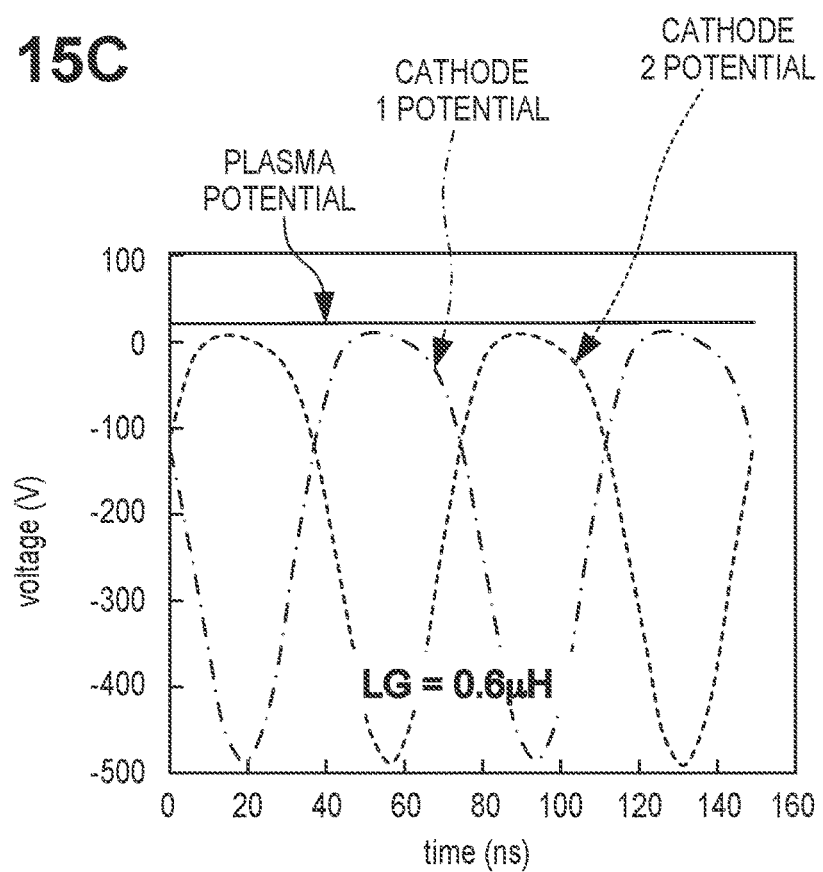
F I G. 15D
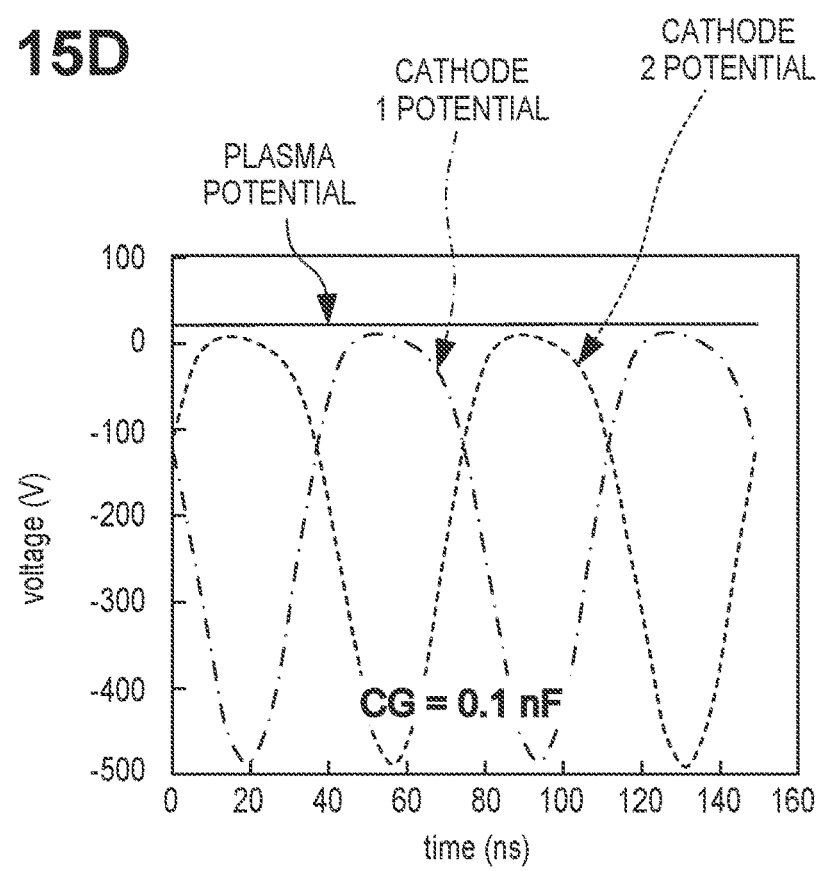

CATHODE 1 AREA : GROUND AREA : CATHODE 2 AREA = 1 : 0.5 : 1

CATHODE 1 AREA : GROUND AREA : CATHODE 2 AREA = 1 : 1 : 1

PLASMA PROCESSING APPARATUS

CROSS-REFERENCE TO RELATED APPLICATION(S)

This application is a continuation of U.S. patent application Ser. No. 16/720,156, filed Dec. 19, 2019, which is a continuation application is a continuation of International Patent Application No. PCT/JP2018/024154 filed on Jun. 26, 2018, which claims priority to and the benefit of International Patent Application No. PCT/JP2017/023611 filed Jun. 27, 2017, International Patent Application No. PCT/JP2017/023603 filed Jun. 27, 2017, and Japanese Patent Application No. 2018-017548 filed Feb. 2, 2018, the entire disclosures of which are incorporated herein by reference.

TECHNICAL FIELD

The present invention relates to a plasma processing apparatus.

BACKGROUND ART

There is provided a plasma processing apparatus that generates plasma by applying a high frequency between two electrodes and processes a substrate by the plasma. Such plasma processing apparatus can operate as an etching apparatus or a sputtering apparatus by the bias and/or the area ratio of the two electrodes. The plasma processing apparatus configured as a sputtering apparatus includes the first electrode that holds a target and the second electrode that holds a substrate. A high frequency is applied between the first and second electrodes, and plasma is generated between the first and second electrodes (between the target and the substrate). When plasma is generated, a self-bias voltage is generated on the surface of the target. This causes ions to collide against the target, and the particles of a material constituting the target are discharged from the target.

PTL 1 describes a sputtering apparatus including a grounded chamber, a target electrode connected to an RF source via impedance matching circuitry, and a substrate holding electrode grounded via a substrate electrode tuning circuit.

In the sputtering apparatus described in PTL 1, the chamber can function as an anode in addition to the substrate holding electrode. The self-bias voltage can depend on the state of a portion that can function as a cathode and the state of a portion that can function as an anode. Therefore, if the chamber functions as an anode in addition to the substrate holding electrode, the self-bias voltage can change depending on the state of a portion of the chamber that functions as an anode. The change in self-bias voltage changes a plasma potential, and the change in plasma potential can influence the characteristic of a film to be formed.

If a film is formed on a substrate using the sputtering apparatus, a film can also be formed on the inner surface of the chamber. This may change the state of the portion of the chamber that can function as an anode. Therefore, if the sputtering apparatus is continuously used, the self-bias voltage changes depending on the film formed on the inner surface of the chamber, and the plasma potential can also change. Consequently, if the sputtering apparatus is used for a long period, it is conventionally difficult to keep the characteristic of the film formed on the substrate constant.

Similarly, if the etching apparatus is used for a long period, the self-bias voltage changes depending on the film formed on the inner surface of the chamber, and this may change the plasma potential. Consequently, it is difficult to keep the etching characteristic of the substrate constant.

CITATION LIST

Patent Literature

PTL 1: Japanese Patent Publication No. 55-35465

SUMMARY OF INVENTION

Technical Problem

The present invention has been made based on the above problem recognition, and provides a technique advantageous in stabilizing a plasma potential in long-term use.

According to one aspect of the present invention, there is provided a plasma processing apparatus comprising a balun including a first unbalanced terminal, a second unbalanced terminal, a first balanced terminal, and a second balanced terminal, a grounded vacuum container, a first electrode electrically connected to the first balanced terminal, a second electrode electrically connected to the second balanced terminal, and a ground electrode arranged in the vacuum container and grounded.

BRIEF DESCRIPTION OF DRAWINGS

FIG. 4 is a table exemplifying the relationship among currents I1 (=I2), I2', and I3, ISO, and α(=X/Rp);

FIG. 15C is a timing chart showing a result of simulating a plasma potential and two cathode potentials when $1.5 \leq X/Rp \leq 5000$ is satisfied;

FIG. 15D is a timing chart showing a result of simulating a plasma potential and two cathode potentials when $1.5 \leq X/Rp \leq 5000$ is satisfied;

DESCRIPTION OF EMBODIMENTS

The present invention will be described below with reference to the accompanying drawings by way of exemplary embodiments.

Figure 1:
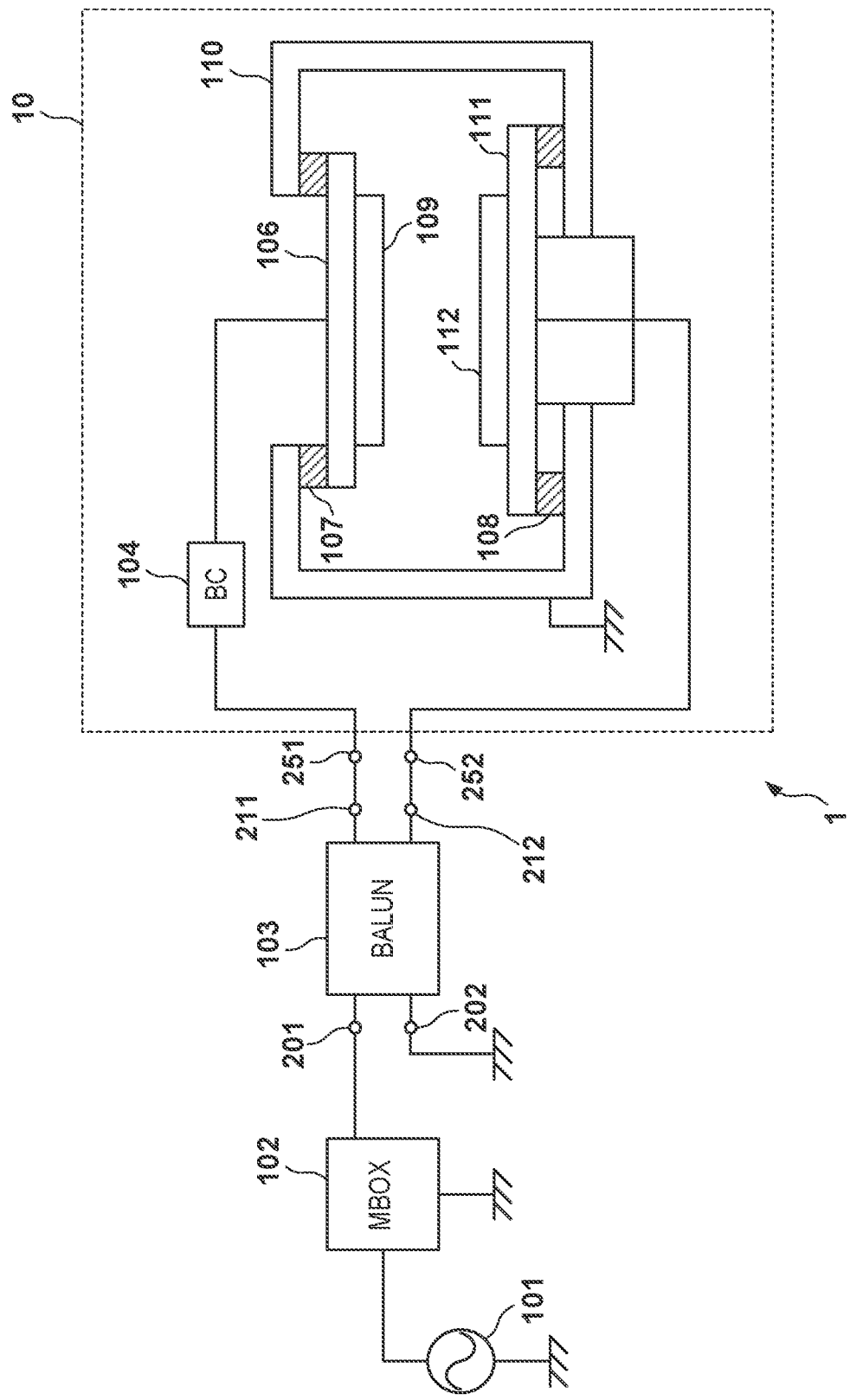
FIG. 1 is a circuit diagram schematically showing the arrangement of a plasma processing apparatus 1 according to the first embodiment of the present invention.

FIG. 1 schematically shows the arrangement of a plasma processing apparatus 1 according to the first embodiment of the present invention. The plasma processing apparatus according to the first embodiment can operate as a sputtering apparatus that forms a film on a substrate 112 by sputtering. The plasma processing apparatus 1 includes a balun (balanced/unbalanced conversion circuit) 103, a vacuum container 110, a first electrode 106, and a second electrode 111. Alternatively, it may be understood that the plasma processing apparatus 1 includes the balun 103 and a main body 10, and the main body 10 includes the vacuum container 110, the first electrode 106, and the second electrode 111. The main body 10 includes a first terminal 251 and a second terminal 252. The first electrode 106 may be arranged to separate a vacuum space and an external space (that is, to form part of a vacuum partition) in cooperation with the vacuum container 110, or may be arranged in the vacuum container 110. The second electrode 111 may be arranged to separate a vacuum space and an external space (that is, to form part of a vacuum partition) in cooperation with the vacuum container 110, or may be arranged in the vacuum container 110.

The balun 103 includes a first unbalanced terminal 201, a second unbalanced terminal 202, a first balanced terminal 211, and a second balanced terminal 212. An unbalanced circuit is connected to the first unbalanced terminal 201 and the second unbalanced terminal 202 of the balun 103, and a balanced circuit is connected to the first balanced terminal 211 and the second balanced terminal 212 of the balun 103. The vacuum container 110 is formed by a conductor, and is grounded.

In the first embodiment, the first electrode 106 serves as a cathode, and holds a target 109. The target 109 can be, for example, an insulator material or a conductor material. Furthermore, in the first embodiment, the second electrode 111 serves as an anode, and holds the substrate 112. The plasma processing apparatus 1 according to the first embodiment can operate as a sputtering apparatus that forms a film on the substrate 112 by sputtering the target 109. The first electrode 106 is electrically connected to the first balanced terminal 211, and the second electrode 111 is electrically connected to the second balanced terminal 212. When the first electrode 106 and the first balanced terminal 211 are electrically connected to each other, this indicates that a current path is formed between the first electrode 106 and the first balanced terminal 211 so that a current flows between the first electrode 106 and the first balanced terminal 211. Similarly, in this specification, when a and b are electrically connected, this indicates that a current path is formed between a and b so that a current flows between a and b.

The above arrangement can be understood as an arrangement in which the first electrode 106 is electrically connected to the first terminal 251, the second electrode 111 is electrically connected to the second terminal 252, the first terminal 251 is electrically connected to the first balanced terminal 211, and the second terminal 252 is electrically connected to the second balanced terminal 212.

In the first embodiment, the first electrode 106 and the first balanced terminal 211 (first terminal 251) are electrically connected via a blocking capacitor 104. The blocking capacitor 104 blocks a DC current between the first balanced terminal 211 and the first electrode 106 (or between the first balanced terminal 211 and the second balanced terminal 212). Instead of providing the blocking capacitor 104, an impedance matching circuit 102 (to be described later) may be configured to block a DC current flowing between the first unbalanced terminal 201 and the second unbalanced terminal 202. The first electrode 106 can be supported by the vacuum container 110 via an insulator 107. The second electrode 111 can be supported by the vacuum container 110 via an insulator 108. Alternatively, the insulator 108 can be arranged between the second electrode 111 and the vacuum container 110.

The plasma processing apparatus 1 can further include a high-frequency power supply 101, and the impedance matching circuit 102 arranged between the high-frequency power supply 101 and the balun 103. The high-frequency power supply 101 supplies a high frequency (high-frequency current, high-frequency voltage, and high-frequency power) between the first unbalanced terminal 201 and the second unbalanced terminal 202 of the balun 103 via the impedance matching circuit 102. In other words, the high-frequency power supply 101 supplies a high frequency (high-frequency current, high-frequency voltage, and high-frequency power) between the first electrode 106 and the second electrode 111 via the impedance matching circuit 102, the balun 103, and the blocking capacitor 104. Alternatively, the high-frequency power supply 101 can be understood to supply a high frequency between the first terminal 251 and the second terminal 252 of the main body 10 via the impedance matching circuit 102 and the balun 103.

A gas (for example, Ar, Kr, or Xe gas) is supplied to the internal space of the vacuum container 110 through a gas supply unit (not shown) provided in the vacuum container 110. In addition, the high-frequency power supply 101 supplies a high frequency between the first electrode 106 and the second electrode 111 via the impedance matching circuit 102, the balun 103, and the blocking capacitor 104. This generates plasma between the first electrode 106 and the second electrode 111, and generates a self-bias voltage on the surface of the target 109 to cause ions in the plasma to collide against the surface of the target 109, thereby discharging, from the target 109, the particles of a material constituting the target 109. Then, the particles form a film on the substrate 112.

Figure 2A:
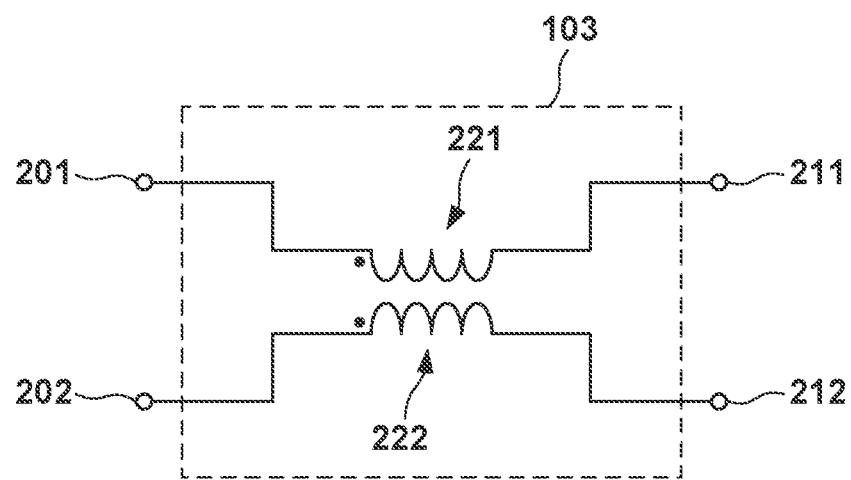
FIG. 2A is a circuit diagram showing an example of the arrangement of a balun.

FIG. 2A shows an example of the arrangement of the balun 103. The balun 103 shown in FIG. 2A includes a first coil 221 that connects the first unbalanced terminal 201 and the first balanced terminal 211, and a second coil 222 that connects the second unbalanced terminal 202 and the second balanced terminal 212. The first coil 221 and the second coil 222 are coils having the same number of turns, and share an iron core.

Figure 2B:
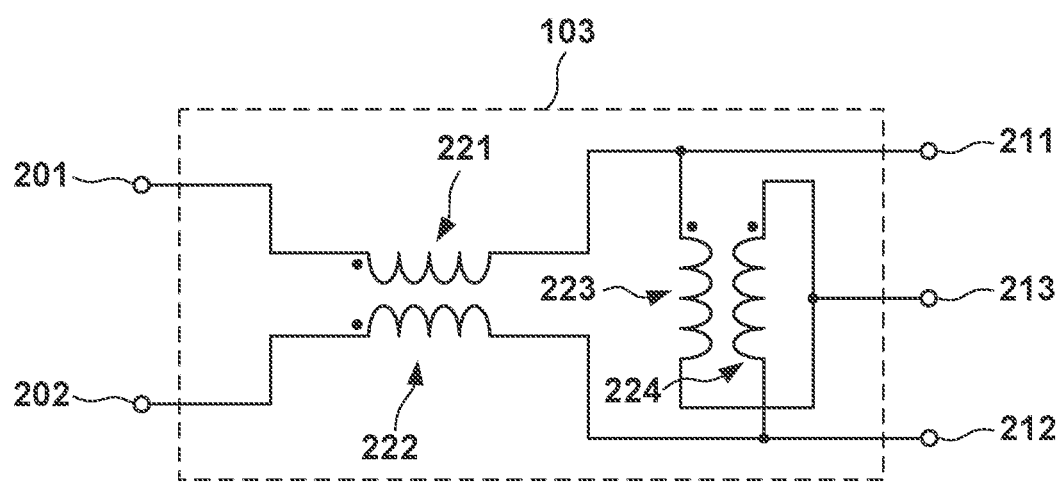
FIG. 2B is a circuit diagram showing another example of the arrangement of the balun.

FIG. 2B shows another example of the arrangement of the balun 103. The balun 103 shown in FIG. 2B includes a first coil 221 that connects the first unbalanced terminal 201 and the first balanced terminal 211, and a second coil 222 that connects the second unbalanced terminal 202 and the second balanced terminal 212. The first coil 221 and the second coil 222 are coils having the same number of turns, and share an iron core. The balun 103 shown in FIG. 2B further includes a third coil 223 and a fourth coil 224 both of which are connected between the first balanced terminal 211 and the second balanced terminal 212. The third coil 223 and the fourth coil 224 are configured so that the voltage of a connection node 213 of the third coil 223 and the fourth coil 224 is set as the midpoint between the voltage of the first balanced terminal 211 and that of the second balanced terminal 212. The third coil 223 and the fourth coil 224 are coils having the same number of turns, and share an iron core. The connection node 213 may be grounded, may be connected to the vacuum container 110, or may be floated.

The function of the balun 103 will be described with reference to FIG. 3. Let I1 be a current flowing through the first unbalanced terminal 201, I2 be a current flowing through the first balanced terminal 211, I2' be a current flowing through the second unbalanced terminal 202, and I3 be a current, of the current I2, flowing to ground. When I3=0, that is, no current flows to ground on the balanced circuit side, the isolation performance of the balanced circuit with respect to ground is highest. When I3=I2, that is, all the current I2 flowing through the first balanced terminal 211 flows to ground, the isolation performance of the balanced circuit with respect to ground is lowest. An index ISO representing the degree of the isolation performance is given by an equation below. Under this definition, as the absolute value of the index ISO is larger, the isolation performance is higher.

$$ISO[dB]=20\ \log(I3/I2')$$

Figure 3:
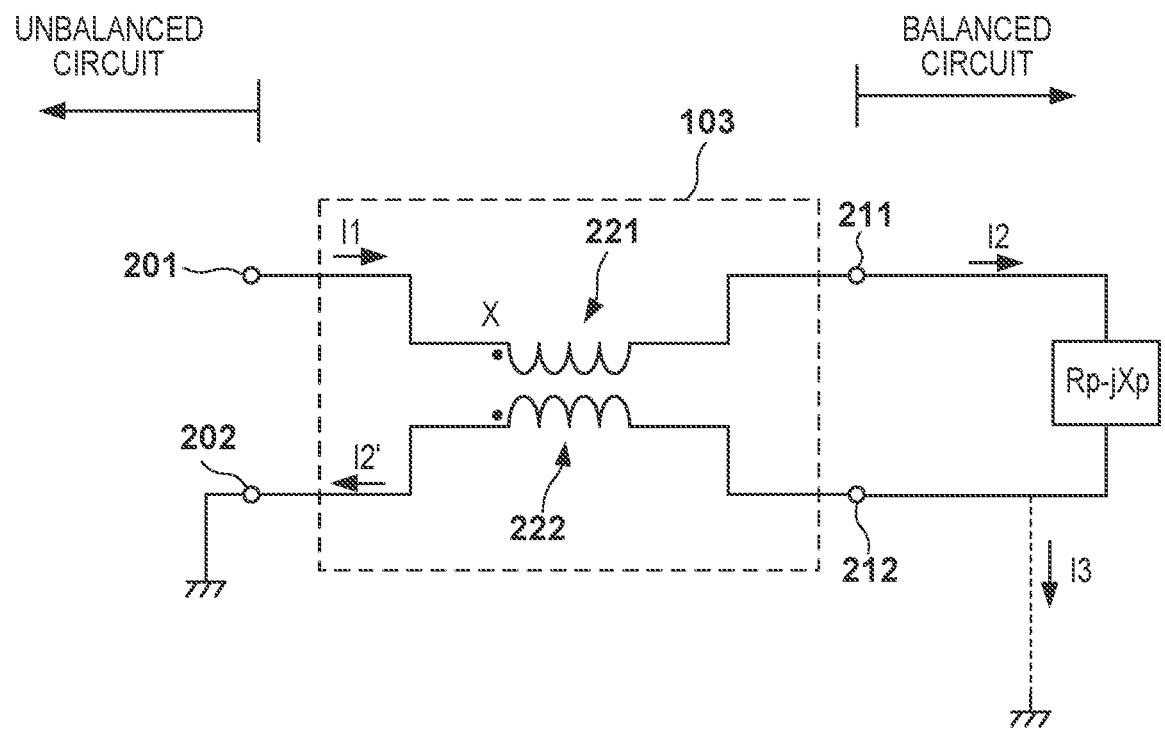
FIG. 3 is a circuit diagram for explaining the function of a balun 103.

In FIG. 3, Rp−jXp represents an impedance (including the reactance of the blocking capacitor 104) when viewing the side of the first electrode 106 and the second electrode 111 (the side of the main body 10) from the side of the first balanced terminal 211 and the second balanced terminal 212 in a state in which plasma is generated in the internal space of the vacuum container 110. Rp represents a resistance component, and −Xp represents a reactance component. Furthermore, in FIG. 3, X represents the reactance component (inductance component) of the impedance of the first coil 221 of the balun 103. ISO has a correlation with X/Rp.

FIG. 4 exemplifies the relationship among the currents I1(=I2), I2', and I3, ISO, and α(=X/Rp). The present inventor found that the arrangement for supplying a high frequency between the first electrode 106 and the second electrode 111 from the first high-frequency power supply 101 via the balun 103, especially satisfying 1.5≤X/Rp≤5000 in this arrangement is advantageous in making the potential (plasma potential) of plasma formed in the internal space (the space between the first electrode 106 and the second electrode 111) of the vacuum container 110 insensitive to the state of the inner surface of the vacuum container 110. When the plasma potential is insensitive to the state of the inner surface of the vacuum container 110, this indicates that it is possible to stabilize the plasma potential even if the plasma processing apparatus 1 is used for a long period. 1.5≤X/Rp≤5000 corresponds to −10.0 dB≥ISO≥−80 dB.

Figure 5A:
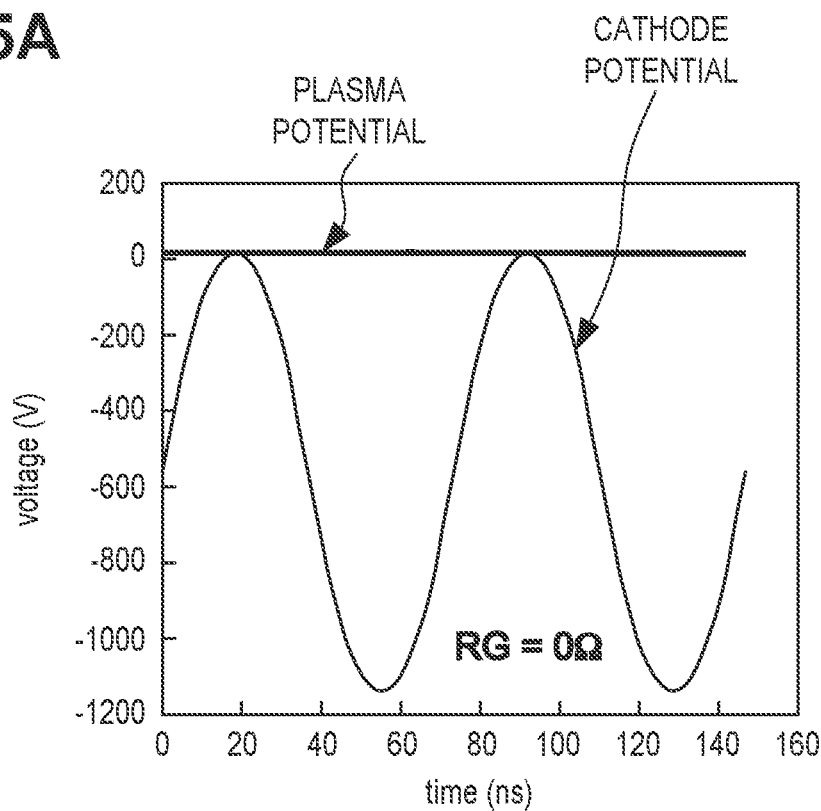
FIG. 5A is a timing chart showing a result of simulating a plasma potential and a cathode potential when $1.5 \leq X/Rp \leq 5000$ is satisfied.
Figure 5B:
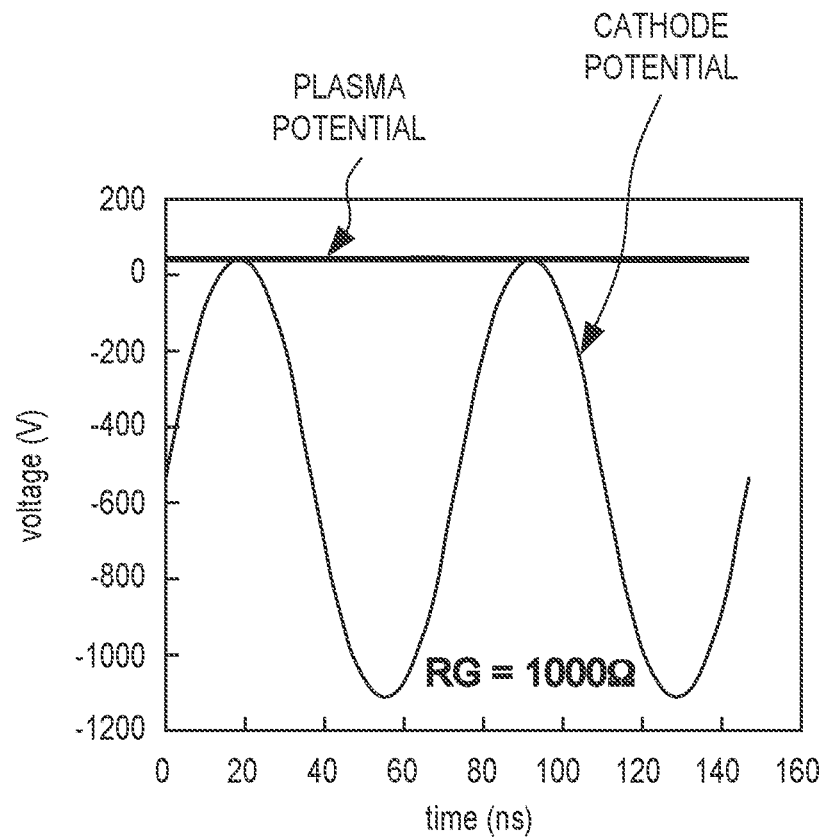
FIG. 5B is a timing chart showing a result of simulating a plasma potential and a cathode potential when $1.5 \leq X/Rp \leq 5000$ is satisfied.
Figure 5C:
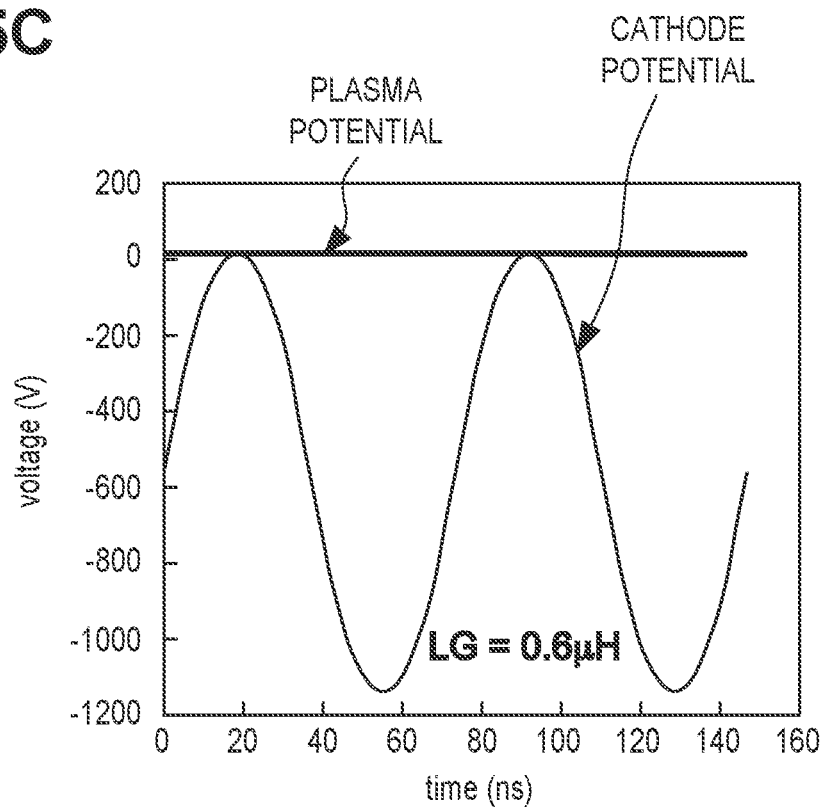
FIG. 5C is a timing chart showing a result of simulating a plasma potential and a cathode potential when $1.5 \leq X/Rp \leq 5000$ is satisfied.
Figure 5D:
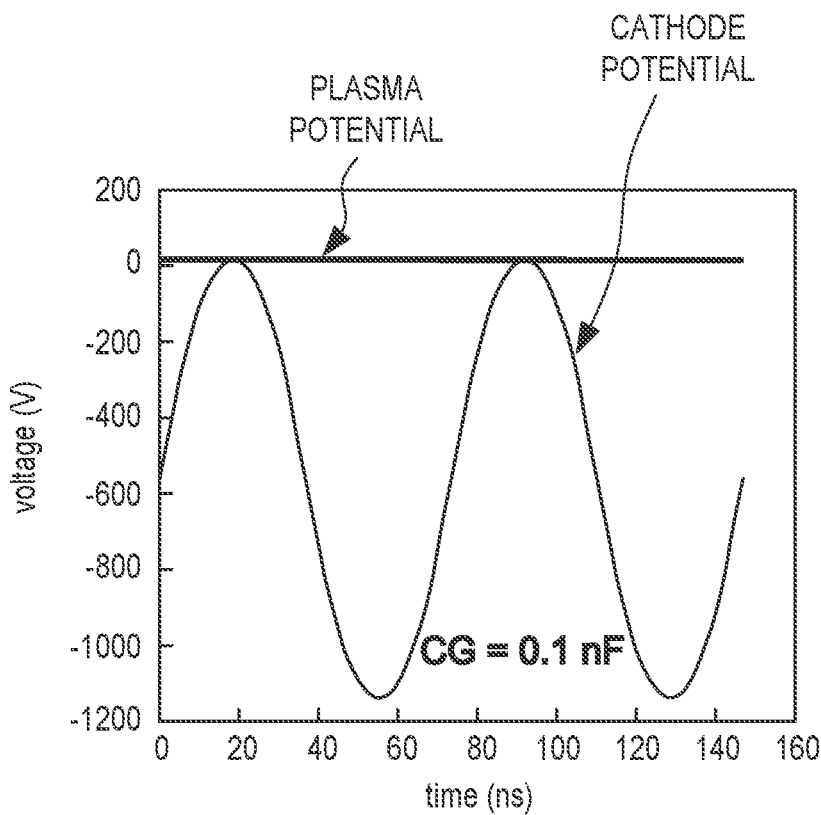
FIG. 5D is a timing chart showing a result of simulating a plasma potential and a cathode potential when $1.5 \leq X/Rp \leq 5000$ is satisfied.

FIGS. 5A to 5D each show a result of simulating the plasma potential and the potential (cathode potential) of the first electrode 106 when 1.5≤X/Rp≤5000 is satisfied. FIG. 5A shows the plasma potential and the cathode potential in a state in which no film is formed on the inner surface of the vacuum container 110. FIG. 5B shows the plasma potential and the cathode potential in a state in which a resistive film (1,000Ω) is formed on the inner surface of the vacuum container 110. FIG. 5C shows the plasma potential and the cathode potential in a state in which an inductive film (0.6 pH) is formed on the inner surface of the vacuum container 110. FIG. 5D shows the plasma potential and the cathode potential in a state in which a capacitive film (0.1 nF) is formed on the inner surface of the vacuum container 110. With reference to FIGS. 5A to 5D, it is understood that satisfying 1.5≤X/Rp≤5000 is advantageous in stabilizing the plasma potential in various states of the inner surface of the vacuum container 110.

Figure 6A:
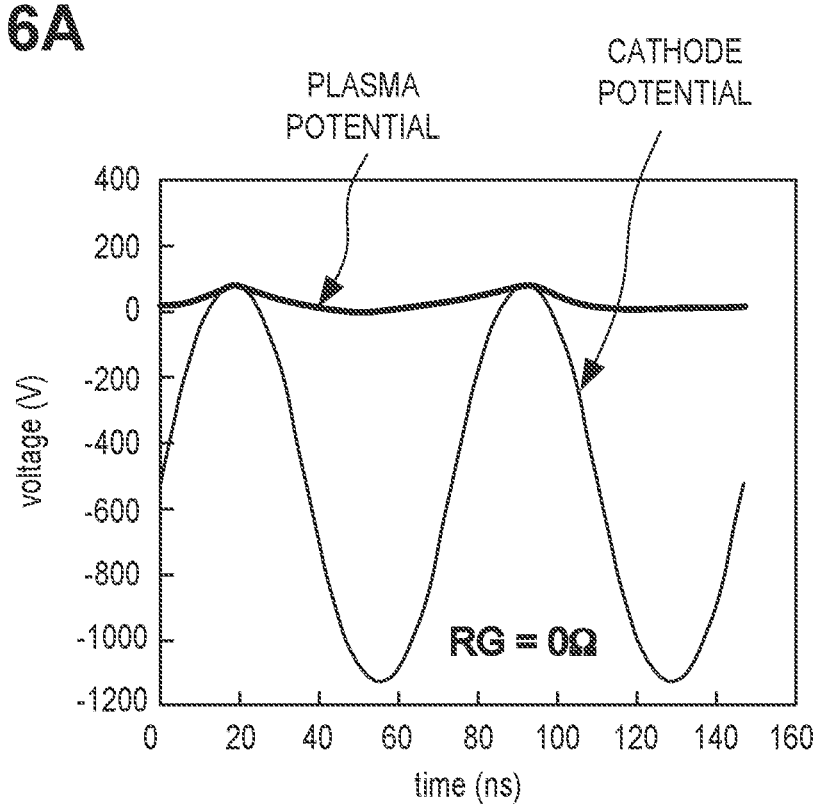
FIG. 6A is a timing chart showing a result of simulating a plasma potential and a cathode potential when $1.5 \leq X/Rp \leq 5000$ is not satisfied.
Figure 6B:
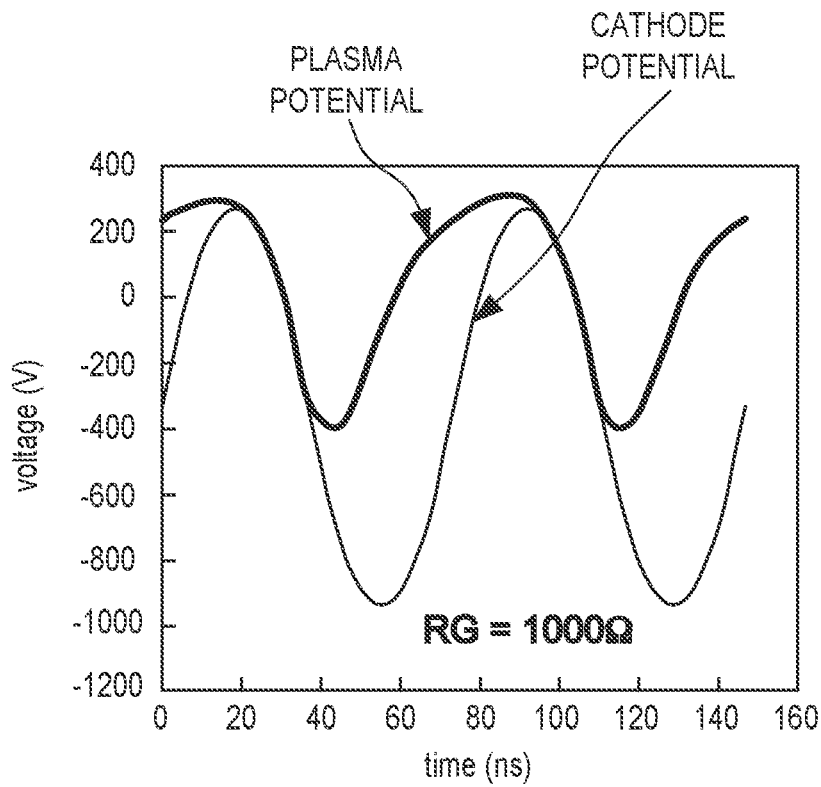
FIG. 6B is a timing chart showing a result of simulating a plasma potential and a cathode potential when $1.5 \leq X/Rp \leq 5000$ is not satisfied.
Figure 6C:
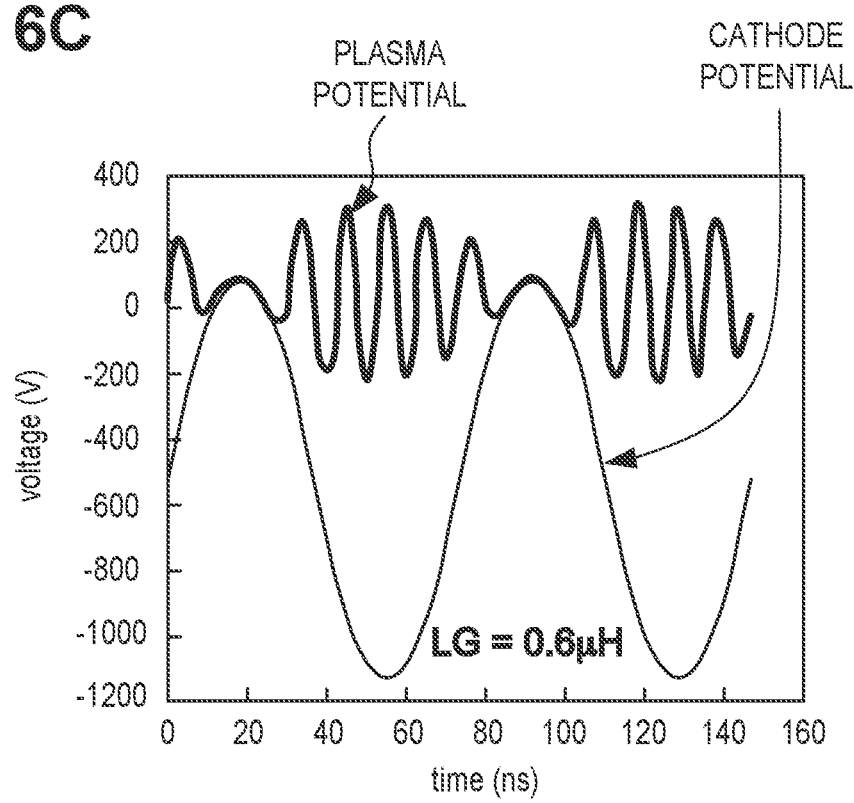
FIG. 6C is a timing chart showing a result of simulating a plasma potential and a cathode potential when $1.5 \leq X/Rp \leq 5000$ is not satisfied.
Figure 6D:
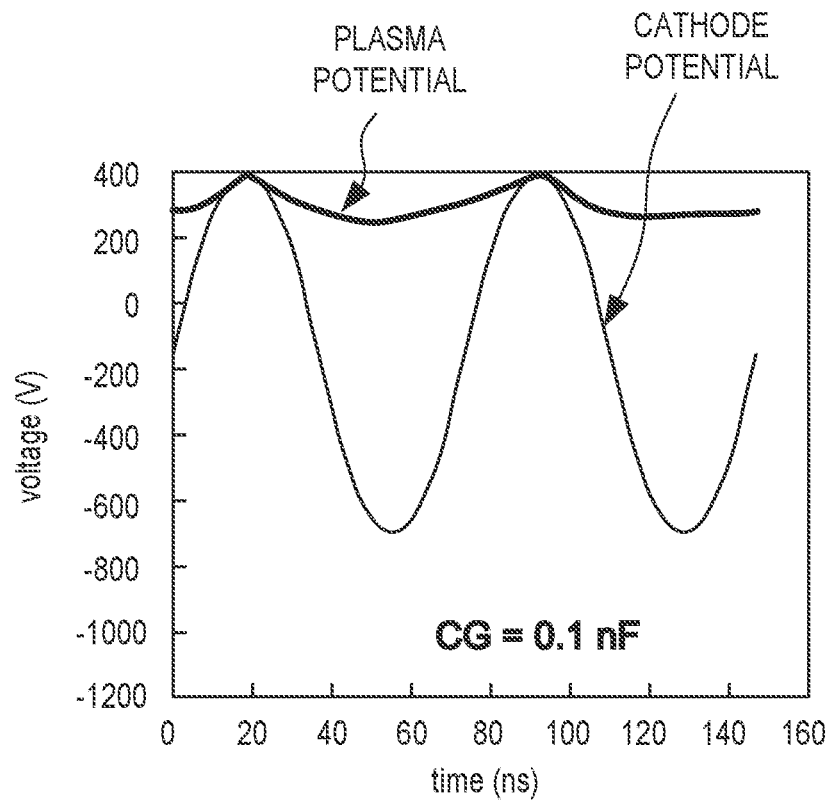
FIG. 6D is a timing chart showing a result of simulating a plasma potential and a cathode potential when $1.5 \leq X/Rp \leq 5000$ is not satisfied.

FIGS. 6A to 6D each show a result of simulating the plasma potential and the potential (cathode potential) of the first electrode 106 when 1.5≤X/Rp≤5000 is not satisfied. FIG. 6A shows the plasma potential and the cathode potential in a state in which no film is formed on the inner surface of the vacuum container 110. FIG. 6B shows the plasma potential and the cathode potential in a state in which a resistive film (1,000Ω) is formed on the inner surface of the vacuum container 110. FIG. 6C shows the plasma potential and the cathode potential in a state in which an inductive film (0.6 pH) is formed on the inner surface of the vacuum container 110. FIG. 6D shows the plasma potential and the cathode potential in a state in which a capacitive film (0.1 nF) is formed on the inner surface of the vacuum container 110. With reference to FIGS. 6A to 6D, it is understood that when 1.5≤X/Rp≤5000 is not satisfied, the plasma potential can change depending on the state of the inner surface of the vacuum container 110.

In both the case in which X/Rp>5000 (for example, X/Rp=∞) is satisfied and the case in which X/Rp<1.5 (for example, X/Rp=1.0 or X/Rp=0.5) is satisfied, the plasma potential readily changes depending on the state of the inner surface of the vacuum container 110. If X/Rp>5000 is satisfied, in a state in which no film is formed on the inner surface of the vacuum container 110, discharge occurs only between the first electrode 106 and the second electrode 111. However, if X/Rp>5000 is satisfied, when a film starts to be formed on the inner surface of the vacuum container 110, the plasma potential sensitively reacts to this, and the results exemplified in FIGS. 6A to 6D are obtained. On the other hand, when X/Rp<1.5 is satisfied, a current flowing to ground via the vacuum container 110 is large. Therefore, the influence of the state of the inner surface of the vacuum container 110 (the electrical characteristic of a film formed on the inner surface) is conspicuous, and the plasma potential changes depending on formation of a film. Thus, as described above, the plasma processing apparatus 1 is advantageously configured to satisfy 1.5≤X/Rp≤5000.

Figure 7:
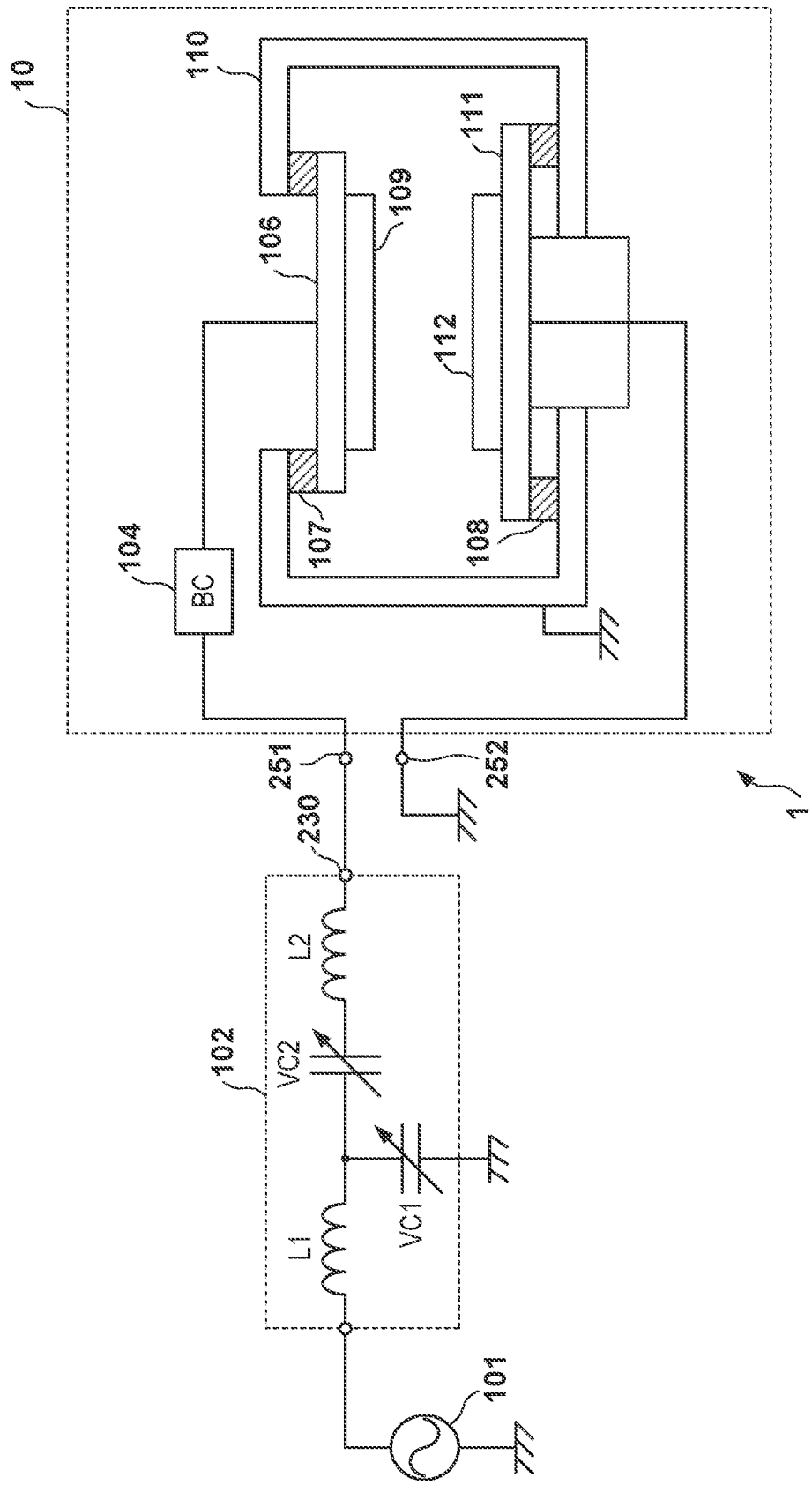
FIG. 7 is a circuit diagram exemplifying a method of confirming Rp−jXp.

A method of deciding Rp−jXp (it is desired to actually know only Rp) will be exemplified with reference to FIG. 7. The balun 103 is detached from the plasma processing apparatus 1 and an output terminal 230 of the impedance matching circuit 102 is connected to the first terminal 251 (blocking capacitor 104) of the main body 10. Furthermore, the second terminal 252 (second electrode 111) of the main body 10 is grounded. In this state, the high-frequency power supply 101 supplies a high frequency to the first terminal 251 of the main body 10 via the impedance matching circuit 102. In the example shown in FIG. 7, the impedance matching circuit 102 is equivalently formed by coils L1 and L2 and variable capacitors VC1 and VC2. It is possible to generate plasma by adjusting the capacitance values of the variable capacitors VC1 and VC2. In the state in which the plasma is stable, the impedance of the impedance matching circuit 102 matches the impedance Rp−jXp on the side of the main body 10 (the side of the first electrode 106 and the second electrode 111) when the plasma is generated. The impedance of the impedance matching circuit 102 at this time is given by Rp+jXp.

Therefore, Rp−jXp (it is desired to actually know only Rp) can be obtained based on the impedance Rp+jXp of the impedance matching circuit 102 when the impedance is matched. Alternatively, for example, Rp−jXp can be obtained by simulation based on design data.

Based on Rp obtained in this way, X/Rp can be specified. For example, the reactance component (inductance component) X of the impedance of the first coil 221 of the balun 103 can be decided based on Rp so as to satisfy 1.5≤X/Rp≤5000.

Figure 8:
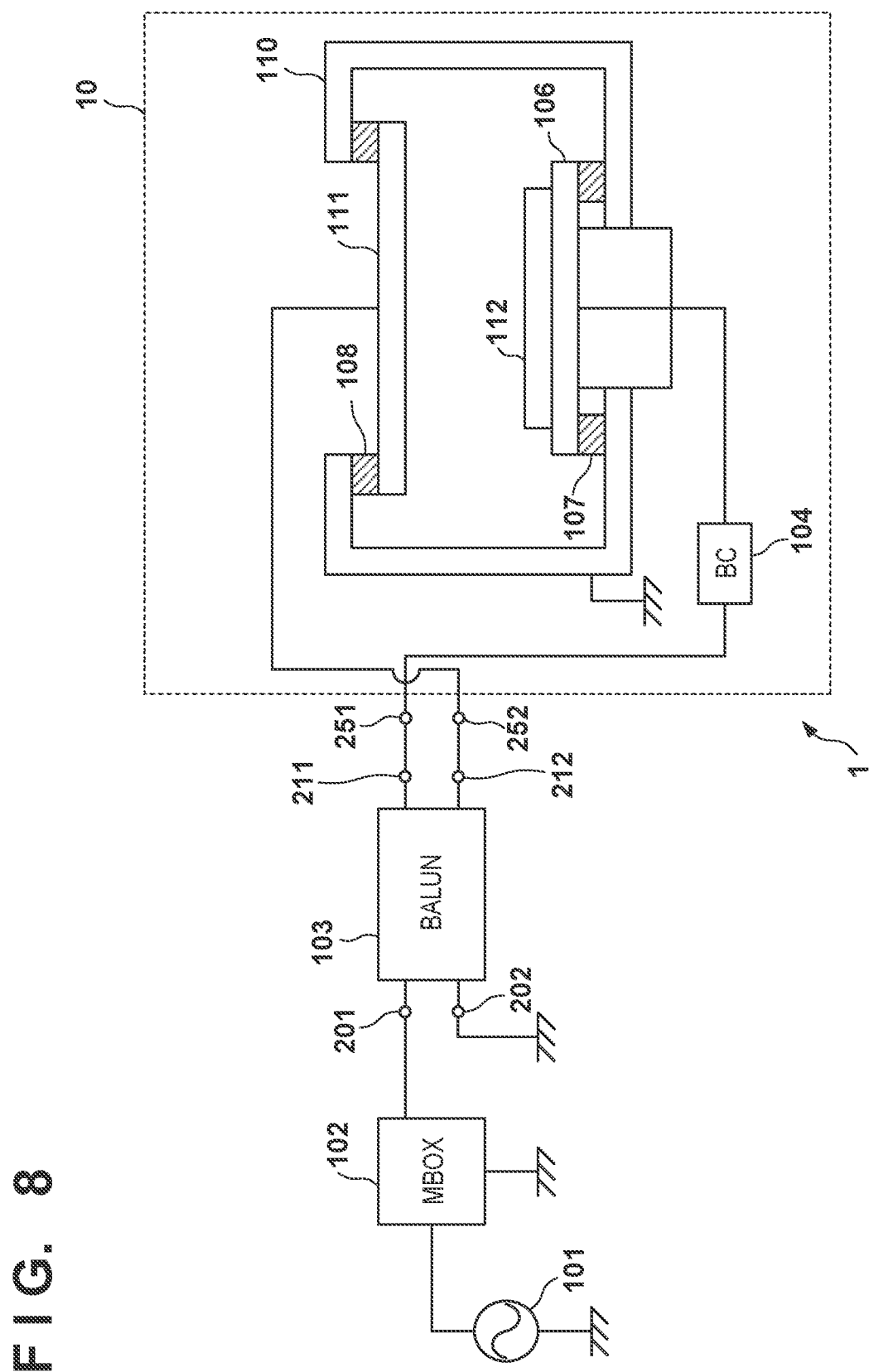
FIG. 8 is a circuit diagram schematically showing the arrangement of a plasma processing apparatus 1 according to the second embodiment of the present invention.

FIG. 8 schematically shows the arrangement of a plasma processing apparatus 1 according to the second embodiment of the present invention. The plasma processing apparatus 1 according to the second embodiment can operate as an etching apparatus that etches a substrate 112. In the second embodiment, a first electrode 106 serves as a cathode, and holds the substrate 112. In the second embodiment, a second electrode 111 serves as an anode. In the plasma processing apparatus 1 according to the second embodiment, the first electrode 106 and a first balanced terminal 211 are electrically connected via a blocking capacitor 104. In other words, in the plasma processing apparatus 1 according to the second embodiment, the blocking capacitor 104 is arranged in an electrical connection path between the first electrode 106 and the first balanced terminal 211.

Figure 9:
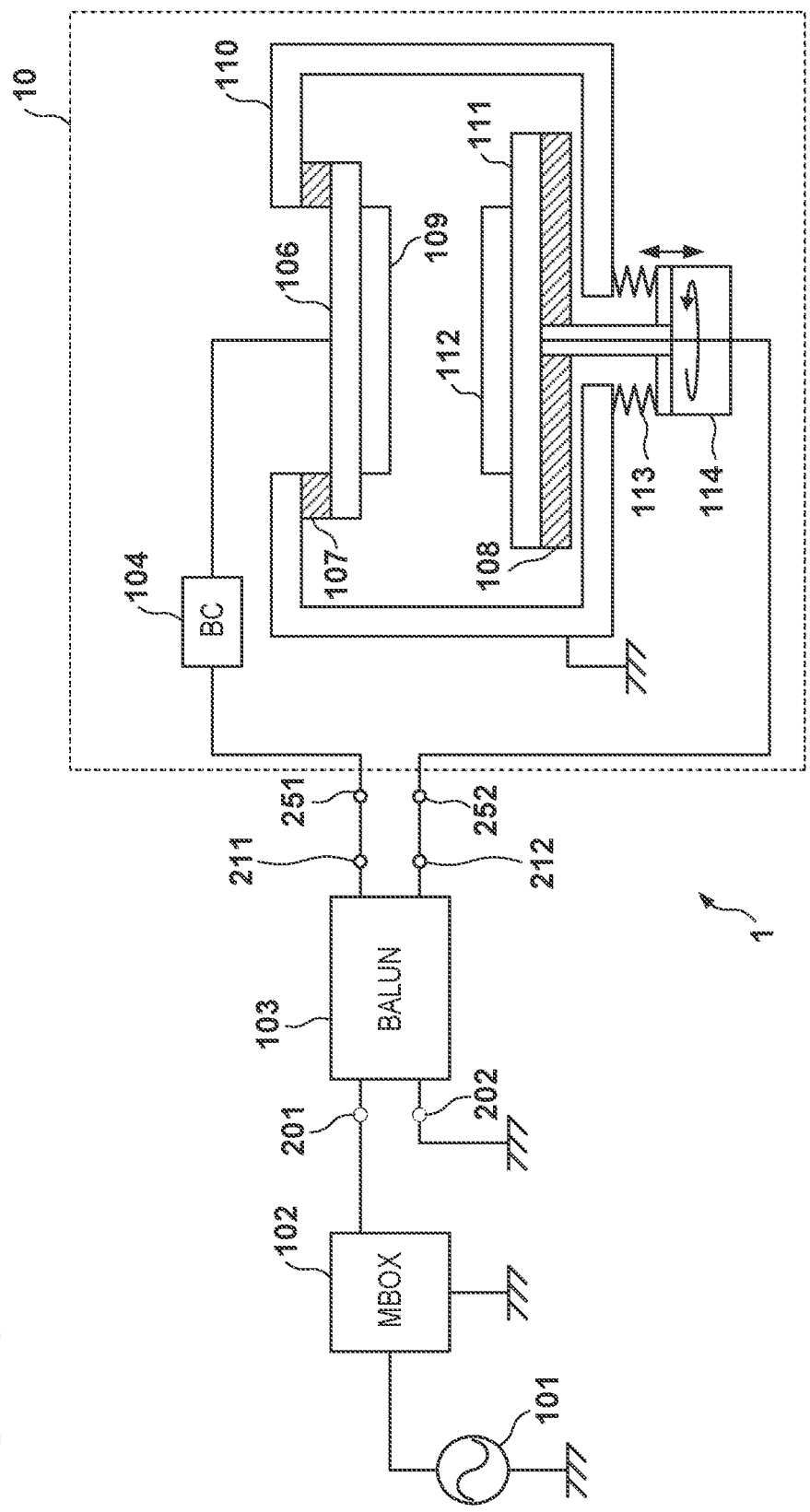
FIG. 9 is a circuit diagram schematically showing the arrangement of a plasma processing apparatus 1 according to the third embodiment of the present invention.

FIG. 9 schematically shows the arrangement of a plasma processing apparatus 1 according to the third embodiment of the present invention. The plasma processing apparatus 1 according to the third embodiment is a modification of the plasma processing apparatus 1 according to the first embodiment, and further includes at least one of a mechanism for vertically moving a second electrode 111 and a mechanism for rotating the second electrode 111. In the example shown in FIG. 9, the plasma processing apparatus 1 includes a driving mechanism 114 having both the mechanism for vertically moving the second electrode 111 and the mechanism for rotating the second electrode 111. A bellows 113 forming a vacuum partition can be provided between a vacuum container 110 and the driving mechanism 114.

Similarly, the plasma processing apparatus 1 according to the second embodiment can further include at least one of a mechanism for vertically moving the first electrode 106 and a mechanism for rotating the first electrode 106.

Figure 10:
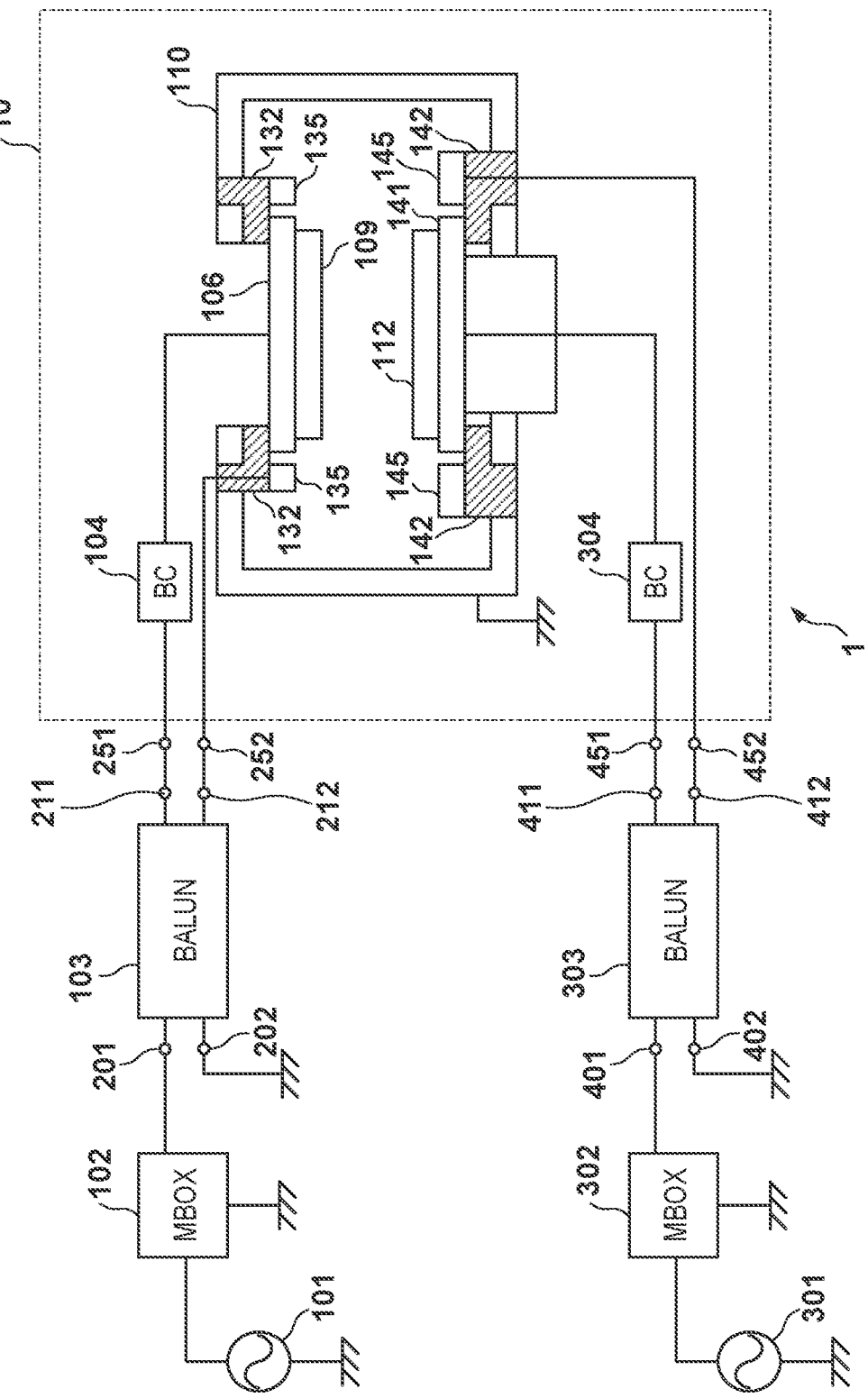
FIG. 10 is a circuit diagram schematically showing the arrangement of a plasma processing apparatus 1 according to the fourth embodiment of the present invention.

FIG. 10 schematically shows the arrangement of a plasma processing apparatus 1 according to the fourth embodiment of the present invention. The plasma processing apparatus according to the fourth embodiment can operate as a sputtering apparatus that forms a film on a substrate 112 by sputtering. Items which are not referred to as the plasma processing apparatus 1 according to the fourth embodiment can comply with the first to third embodiments. The plasma processing apparatus 1 includes a first balun 103, a second balun 303, a vacuum container 110, a first electrode 106 and a second electrode 135 constituting the first pair, and a first electrode 141 and a second electrode 145 constituting the second pair. Alternatively, it may be understood that the plasma processing apparatus 1 includes the first balun 103, the second balun 303, and a main body 10, and the main body 10 includes the vacuum container 110, the first electrode 106 and the second electrode 135 constituting the first pair, and the first electrode 141 and the second electrode 145 constituting the second pair. The main body 10 includes a first terminal 251, a second terminal 252, a third terminal 451, and a fourth terminal 452.

The first balun 103 includes a first unbalanced terminal 201, a second unbalanced terminal 202, a first balanced terminal 211, and a second balanced terminal 212. An unbalanced circuit is connected to the first unbalanced terminal 201 and the second unbalanced terminal 202 of the first balun 103, and a balanced circuit is connected to the first balanced terminal 211 and the second balanced terminal 212 of the first balun 103. The second balun 303 can have an arrangement similar to that of the first balun 103. The second balun 303 includes a first unbalanced terminal 401, a second unbalanced terminal 402, a first balanced terminal 411, and a second balanced terminal 412. An unbalanced circuit is connected to the first unbalanced terminal 401 and the second unbalanced terminal 402 of the second balun 303, and a balanced circuit is connected to the first balanced terminal 411 and the second balanced terminal 412 of the second balun 303. The vacuum container 110 is grounded.

The first electrode 106 of the first pair holds a target 109. The target 109 can be, for example, an insulator material or a conductor material. The second electrode 135 of the first pair is arranged around the first electrode 106. The first electrode 106 of the first pair is electrically connected to the first balanced terminal 211 of the first balun 103, and the second electrode 135 of the first pair is electrically connected to the second balanced terminal 212 of the first balun 103. The first electrode 141 of the second pair holds the substrate 112. The second electrode 145 of the second pair is arranged around the first electrode 141. The first electrode 141 of the second pair is electrically connected to the first balanced terminal 411 of the second balun 303, and the second electrode 145 of the second pair is electrically connected to the second balanced terminal 412 of the second balun 303.

The above arrangement can be understood as an arrangement in which the first electrode 106 of the first pair is electrically connected to the first terminal 251, the second electrode 135 of the first pair is electrically connected to the second terminal 252, the first terminal 251 is electrically connected to the first balanced terminal 211 of the first balun 103, and the second terminal 252 is electrically connected to the second balanced terminal 212 of the first balun 103. The above arrangement can be understood as an arrangement in which the first electrode 141 of the second pair is electrically connected to the third terminal 451, the second electrode 145 of the second pair is electrically connected to the fourth terminal 452, the third terminal 451 is electrically connected to the first balanced terminal 411 of the second balun 303, and the fourth terminal 452 is electrically connected to the second balanced terminal 412 of the second balun 303.

The first electrode 106 of the first pair and the first balanced terminal 211 (first terminal 251) of the first balun 103 can electrically be connected via a blocking capacitor 104. The blocking capacitor 104 blocks a DC current between the first balanced terminal 211 of the first balun 103 and the first electrode 106 of the first pair (or between the first balanced terminal 211 and the second balanced terminal 212 of the first balun 103). Instead of providing the blocking capacitor 104, a first impedance matching circuit 102 may be configured to block a DC current flowing between the first unbalanced terminal 201 and the second unbalanced terminal 202 of the first balun 103. The first electrode 106 and the second electrode 135 of the first pair can be supported by the vacuum container 110 via an insulator 132.

The first electrode 141 of the second pair and the first balanced terminal 411 (third terminal 451) of the second balun 303 can electrically be connected via a blocking capacitor 304. The blocking capacitor 304 blocks a DC current between the first balanced terminal 411 of the second balun 303 and the first electrode 141 of the second pair (or between the first balanced terminal 411 and the second balanced terminal 412 of the second balun 303). Instead of providing the blocking capacitor 304, a second impedance matching circuit 302 may be configured to block a DC current flowing between the first unbalanced terminal 201 and the second unbalanced terminal 202 of the second balun 303. The first electrode 141 and the second electrode 145 of the second pair can be supported by the vacuum container 110 via an insulator 142.

The plasma processing apparatus 1 can include a first high-frequency power supply 101, and the first impedance matching circuit 102 arranged between the first high-frequency power supply 101 and the first balun 103. The first high-frequency power supply 101 supplies a high frequency between the first unbalanced terminal 201 and the second unbalanced terminal 202 of the first balun 103 via the first impedance matching circuit 102. In other words, the first high-frequency power supply 101 supplies a high frequency between the first electrode 106 and the second electrode 135 via the first impedance matching circuit 102, the first balun 103, and the blocking capacitor 104. Alternatively, the first high-frequency power supply 101 supplies a high frequency between the first terminal 251 and the second terminal 252 of the main body 10 via the first impedance matching circuit 102 and the first balun 103. The first balun 103 and the first electrode 106 and the second electrode 135 of the first pair form the first high-frequency supply unit that supplies a high frequency to the internal space of the vacuum container 110.

The plasma processing apparatus 1 can include a second high-frequency power supply 301, and the second impedance matching circuit 302 arranged between the second high-frequency power supply 301 and the second balun 303. The second high-frequency power supply 301 supplies a high frequency between the first unbalanced terminal 401 and the second unbalanced terminal 402 of the second balun 303 via the second impedance matching circuit 302. In other words, the second high-frequency power supply 301 supplies a high frequency between the first electrode 141 and the second electrode 145 of the second pair via the second impedance matching circuit 302, the second balun 303, and the blocking capacitor 304. Alternatively, the second high-frequency power supply 301 supplies a high frequency between the third terminal 451 and the fourth terminal 452 of the main body 10 via the second impedance matching circuit 302 and the second balun 303. The second balun 303 and the first electrode 141 and the second electrode 145 of the second pair form the second high-frequency supply unit that supplies a high frequency to the internal space of the vacuum container 110.

Let $Rp1-jXp1$ be an impedance when viewing the side of the first electrode 106 and the second electrode 135 of the first pair (the side of the main body 10) from the side of the first balanced terminal 211 and the second balanced terminal 212 of the first balun 103 in a state in which plasma is generated in the internal space of the vacuum container 110 by supplying a high frequency from the first high-frequency power supply 101. Let X1 be the reactance component (inductance component) of the impedance of a first coil 221 of the first balun 103. In this definition, satisfying $1.5 \leq X1/Rp1 \leq 5000$ is advantageous in stabilizing the potential of the plasma formed in the internal space of the vacuum container 110.

In addition, let $Rp2-jXp2$ be an impedance when viewing the side of the first electrode 141 and the second electrode 145 of the second pair (the side of the main body 10) from the side of the first balanced terminal 411 and the second balanced terminal 412 of the second balun 303 in a state in which plasma is generated in the internal space of the vacuum container 110 by supplying a high frequency from the second high-frequency power supply 301. Let X2 be the reactance component (inductance component) of the impedance of the first coil 221 of the second balun 303. In this definition, satisfying $1.5 \leq X2/Rp2 \leq 5000$ is advantageous in stabilizing the potential of the plasma formed in the internal space of the vacuum container 110.

Figure 11:
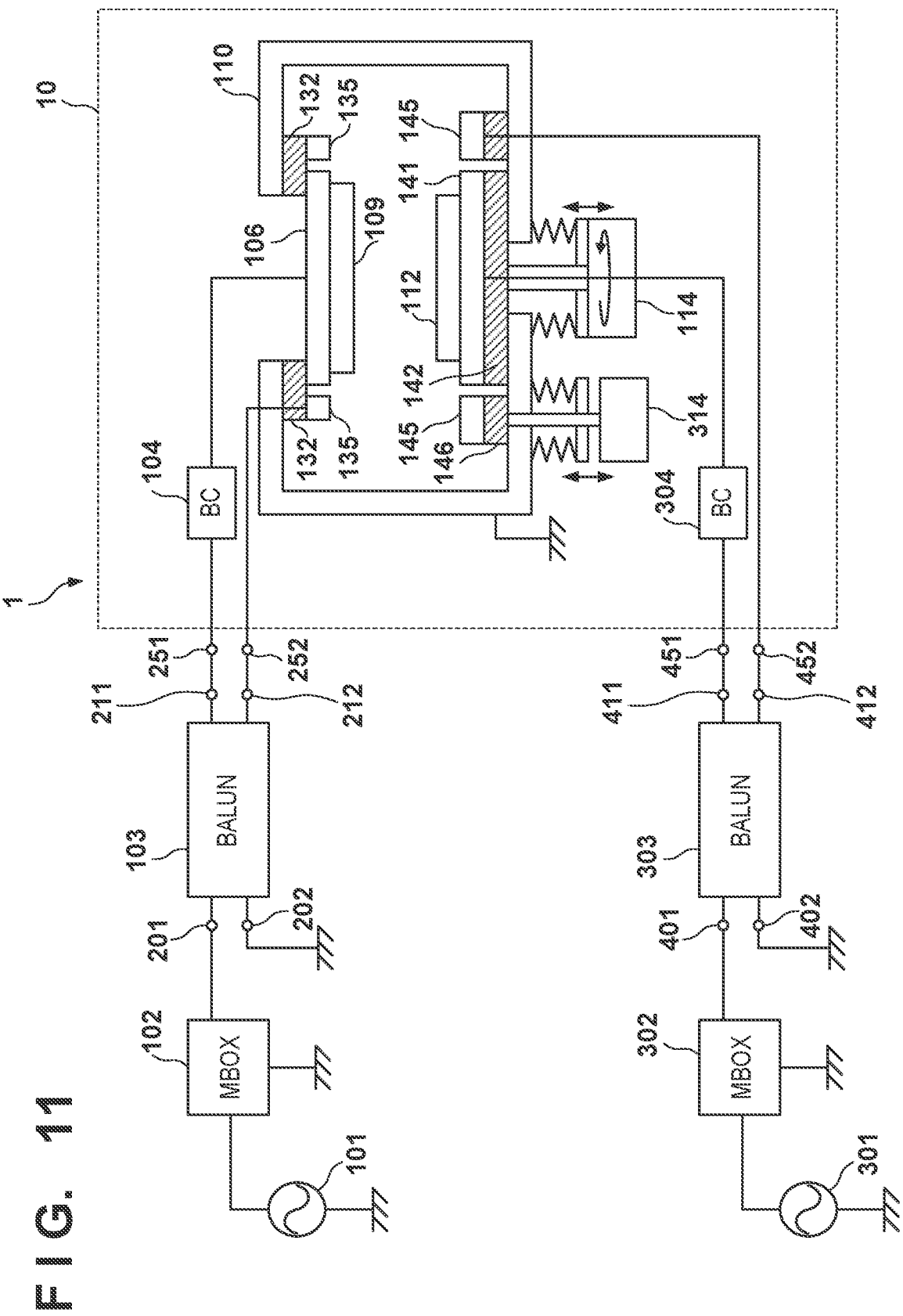
FIG. 11 is a circuit diagram schematically showing the arrangement of a plasma processing apparatus 1 according to the fifth embodiment of the present invention.

FIG. 11 schematically shows the arrangement of a plasma processing apparatus 1 according to the fifth embodiment of the present invention. The apparatus 1 according to the fifth embodiment has an arrangement obtained by adding driving mechanisms 114 and 314 to the plasma processing apparatus 1 according to the fourth embodiment. The driving mechanism 114 can include at least one of a mechanism for vertically moving a first electrode 141 and a mechanism for rotating the first electrode 141. The driving mechanism 314 can include a mechanism for vertically moving a second electrode 145.

Figure 12:
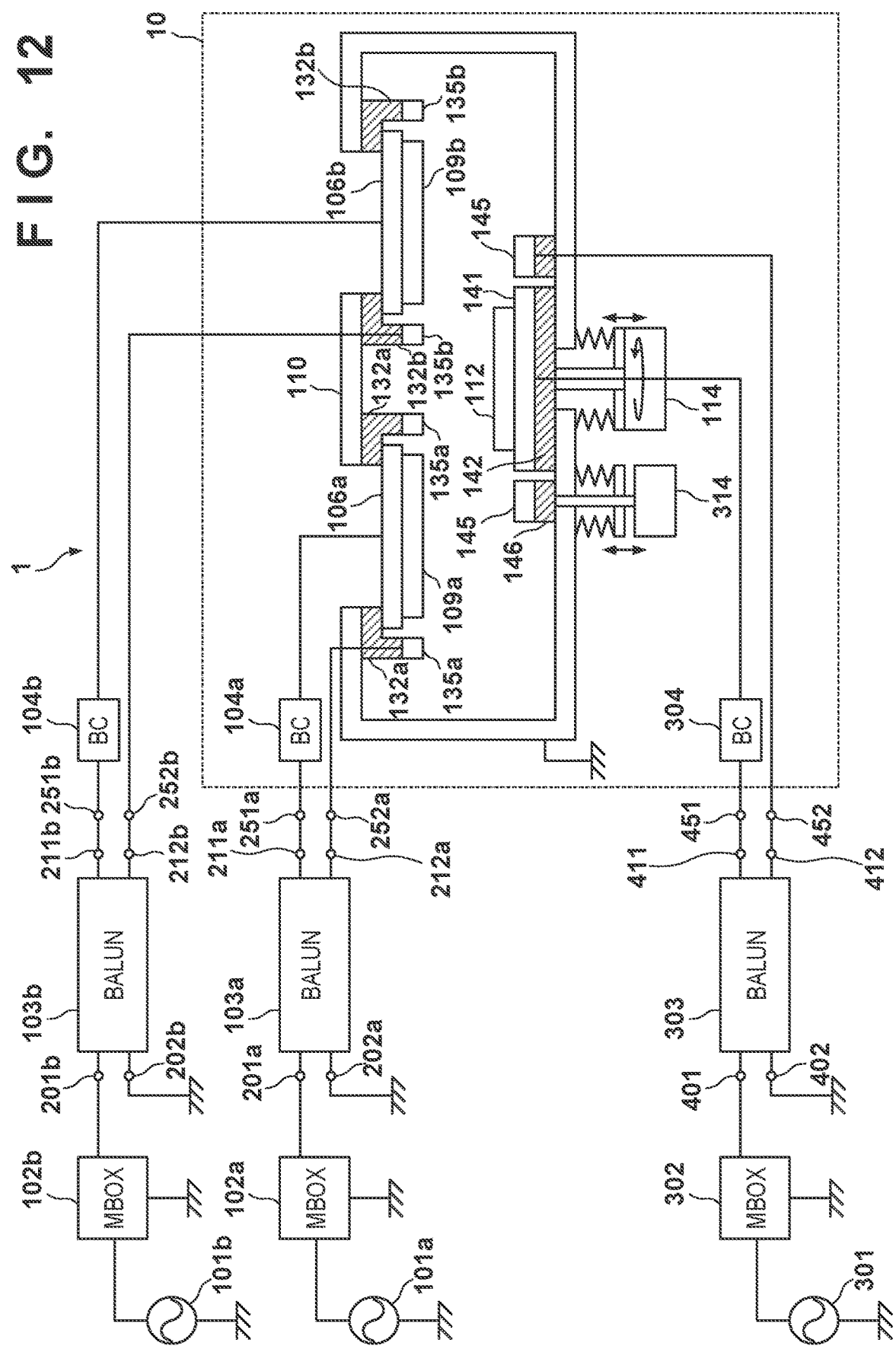
FIG. 12 is a circuit diagram schematically showing the arrangement of a plasma processing apparatus 1 according to the sixth embodiment of the present invention.

FIG. 12 schematically shows the arrangement of a plasma processing apparatus 1 according to the sixth embodiment of the present invention. The plasma processing apparatus according to the sixth embodiment can operate as a sputtering apparatus that forms a film on a substrate 112 by sputtering. Items which are not referred to as the sixth embodiment can comply with the first to fifth embodiments. The plasma processing apparatus 1 according to the sixth embodiment includes a plurality of first high-frequency supply units and at least one second high-frequency supply unit. One of the plurality of first high-frequency supply units can include a first electrode 106a, a second electrode 135a, and a first balun 103a. Another one of the plurality of first high-frequency supply units can include a first electrode 106b, a second electrode 135b, and a first balun 103b. An example in which the plurality of first high-frequency supply units are formed by two high-frequency supply units will be described. In addition, the two high-frequency supply units and constituent elements associated with them are distinguished from each other using subscripts a and b. Similarly, two targets are distinguished from each other using subscripts a and b.

From another viewpoint, the plasma processing apparatus 1 includes the plurality of first baluns 103a and 103b, a second balun 303, a vacuum container 110, the first electrode 106a and the second electrode 135a, the first electrode 106b and the second electrode 135b, and a first electrode 141 and a second electrode 145. Alternatively, it may be understood that the plasma processing apparatus 1 includes the plurality of first baluns 103a and 103b, the second balun 303, and a main body 10, and the main body 10 includes the vacuum container 110, the first electrode 106a and the second electrode 135a, the first electrode 106b and the second electrode 135b, and the first electrode 141 and the second electrode 145. The main body 10 includes first terminals 251a and 251b, second terminals 252a and 252b, a third terminal 451, and a fourth terminal 452.

The first balun 103a includes a first unbalanced terminal 201a, a second unbalanced terminal 202a, a first balanced terminal 211a, and a second balanced terminal 212a. An unbalanced circuit is connected to the first unbalanced terminal 201a and the second unbalanced terminal 202a of the first balun 103a, and a balanced circuit is connected to the first balanced terminal 211a and the second balanced terminal 212a of the first balun 103a. The first balun 103b includes a first unbalanced terminal 201b, a second unbalanced terminal 202b, a first balanced terminal 211b, and a second balanced terminal 212b. An unbalanced circuit is connected to the first unbalanced terminal 201b and the second unbalanced terminal 202b of the first balun 103b, and a balanced circuit is connected to the first balanced terminal 211b and the second balanced terminal 212b of the first balun 103b.

The second balun 303 can have an arrangement similar to that of the first balun 103a or 103b. The second balun 303 includes a first unbalanced terminal 401, a second unbalanced terminal 402, a first balanced terminal 411, and a second balanced terminal 412. An unbalanced circuit is connected to the first unbalanced terminal 401 and the second unbalanced terminal 402 of the second balun 303, and a balanced circuit is connected to the first balanced terminal 411 and the second balanced terminal 412 of the second balun 303. The vacuum container 110 is grounded.

The first electrodes 106a and 106b hold targets 109a and 109b, respectively. Each of the targets 109a and 109b can be, for example, an insulator material or a conductor material. The second electrodes 135a and 135b are arranged around the first electrodes 106a and 106b, respectively. The first electrodes 106a and 106b are electrically connected to the first balanced terminals 211a and 211b of the first baluns 103a and 103b, respectively, and the second electrodes 135a and 135b are electrically connected to the second balanced terminals 212a and 212b of the first baluns 103a and 103b, respectively.

The first electrode 141 holds the substrate 112. The second electrode 145 is arranged around the first electrode 141. The first electrode 141 is electrically connected to the first balanced terminal 411 of the second balun 303, and the second electrode 145 is electrically connected to the second balanced terminal 412 of the second balun 303.

The above arrangement can be understood as an arrangement in which the first electrodes 106a and 106b are electrically connected to the first terminals 251a and 251b, respectively, the second electrodes 135a and 135b are electrically connected to the second terminals 252a and 252b, respectively, the first terminals 251a and 251b are electrically connected to the first balanced terminals 211a and 111b of the first baluns 103a and 103b, respectively, and the second terminals 252a and 252b are electrically connected to the second balanced terminals 212a and 212b of the first baluns 103a and 103b, respectively. The above arrangement can be understood as an arrangement in which the first electrode 141 is electrically connected to the third terminal 451, the second electrode 145 is electrically connected to the fourth terminal 452, the third terminal 451 is electrically connected to the first balanced terminal 411 of the second balun 303, and the fourth terminal 452 is electrically connected to the second balanced terminal 412 of the second balun 303.

The first electrodes 106a and 106b and the first balanced terminals 211a and 211b (first terminals 251a and 251b) of the first baluns 103a and 103b can electrically be connected via blocking capacitors 104a and 104b, respectively. The blocking capacitors 104a and 104b block DC currents between the first electrodes 106a and 106b and the first balanced terminals 211a and 211b of the first baluns 103a and 103b (or between the first balanced terminals 211a and 211b and the second balanced terminals 212a and 212b of the first baluns 103a and 103b), respectively. Instead of providing the blocking capacitors 104a and 104b, first impedance matching circuits 102a and 102b may be configured to block DC currents flowing between the first unbalanced terminals 201a and 201b and the second unbalanced terminals 202a and 202b of the first baluns 103a and 103b, respectively. Alternatively, the blocking capacitors 104a and 104b may be arranged between the second electrodes 135a and 135b and the second balanced terminals 212a and 212b (second terminals 252a and 252b) of the first baluns 103a and 103b, respectively. The first electrodes 106a and 106b and the second electrodes 135a and 135b can be supported by the vacuum container 110 via insulators 132a and 132b, respectively.

The first electrode 141 and the first balanced terminal 411 (third terminal 451) of the second balun 303 can electrically be connected via a blocking capacitor 304. The blocking capacitor 304 blocks a DC current between the first electrode 141 and the first balanced terminal 411 of the second balun 303 (or between the first balanced terminal 411 and the second balanced terminal 412 of the second balun 303). Instead of providing the blocking capacitor 304, a second impedance matching circuit 302 may be configured to block a DC current flowing between the first unbalanced terminal 201 and the second unbalanced terminal 202 of the second balun 303. Alternatively, the blocking capacitor 304 may be arranged between the second electrode 145 and the second balanced terminal 412 (fourth terminal 452) of the second balun 303. The first electrode 141 and the second electrode 145 can be supported by the vacuum container 110 via an insulator 142.

The plasma processing apparatus 1 can include a plurality of first high-frequency power supplies 101a and 101b, and the first impedance matching circuits 102a and 102b respectively arranged between the plurality of first high-frequency power supplies 101a and 101b and the plurality of first baluns 103a and 103b. The first high-frequency power supplies 101a and 101b supply high frequencies between the first unbalanced terminals 201a and 201b and the second unbalanced terminals 202a and 202b of the first baluns 103a and 103b via the first impedance matching circuits 102a and 102b, respectively. In other words, the first high-frequency power supplies 101a and 101b supply high frequencies between the first electrodes 106a and 106b and the second electrodes 135a and 135b via the first impedance matching circuits 102a and 102b, the first baluns 103a and 103b, and the blocking capacitors 104a and 104b, respectively. Alternatively, the first high-frequency power supplies 101a and 101b supply high frequencies between the first terminals 251a and 251b and the second terminals 252a and 252b of the main body 10 via the first impedance matching circuits 102a and 102b and the first baluns 103a and 103b.

The plasma processing apparatus 1 can include a second high-frequency power supply 301, and the second impedance matching circuit 302 arranged between the second high-frequency power supply 301 and the second balun 303. The second high-frequency power supply 301 supplies a high frequency between the first unbalanced terminal 401 and the second unbalanced terminal 402 of the second balun 303 via the second impedance matching circuit 302. In other words, the second high-frequency power supply 301 supplies a high frequency between the first electrode 141 and the second electrode 145 via the second impedance matching circuit 302, the second balun 303, and the blocking capacitor 304. Alternatively, the second high-frequency power supply 301 supplies a high frequency between the third terminal 451 and the fourth terminal 452 of the main body 10 via the second impedance matching circuit 302 and the second balun 303.

Figure 13:
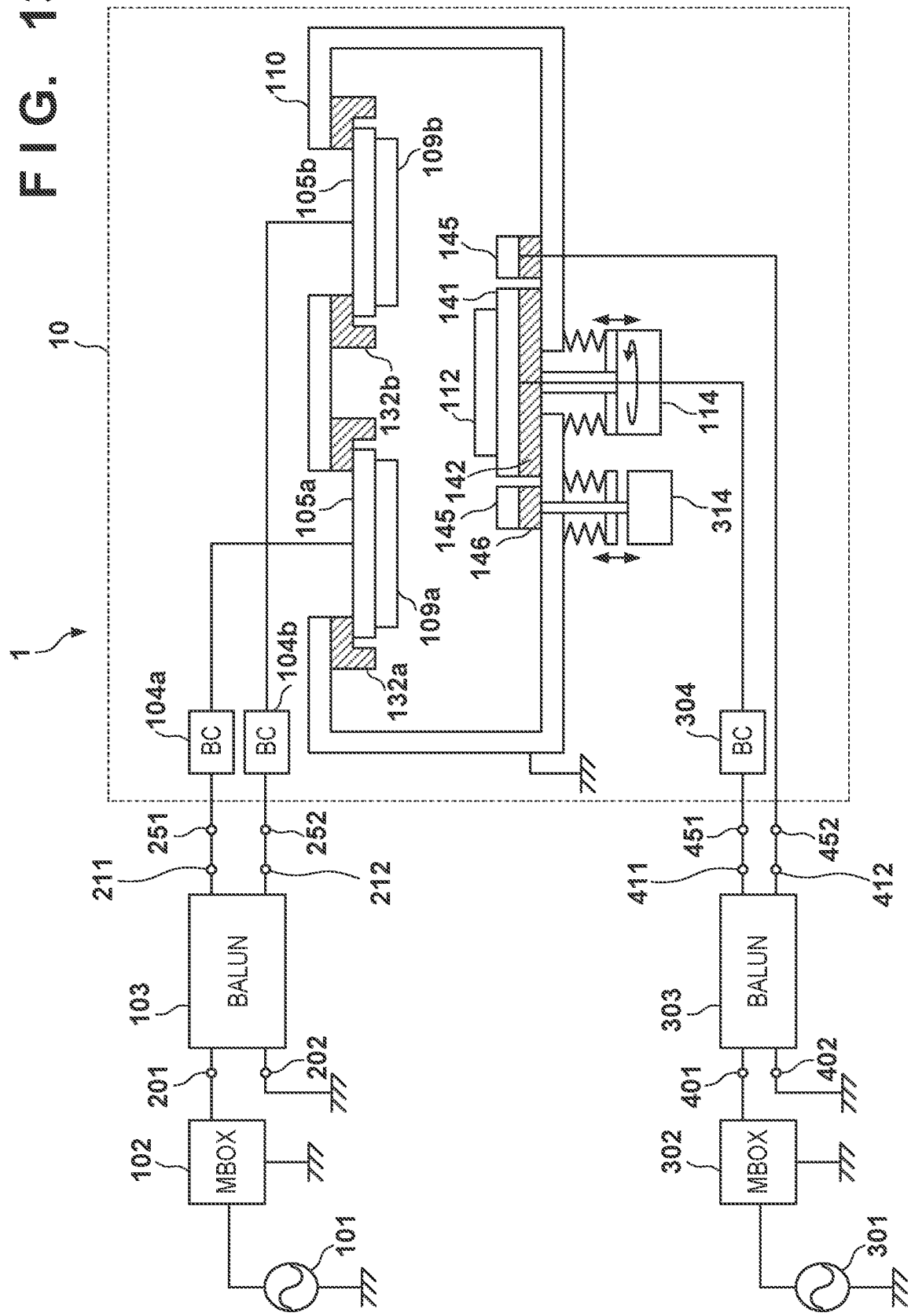
FIG. 13 is a circuit diagram schematically showing the arrangement of a plasma processing apparatus 1 according to the seventh embodiment of the present invention.

FIG. 13 schematically shows the arrangement of a plasma processing apparatus 1 according to the seventh embodiment of the present invention. The plasma processing apparatus according to the seventh embodiment can operate as a sputtering apparatus that forms a film on a substrate 112 by sputtering. Items which are not referred to as the plasma processing apparatus 1 according to the seventh embodiment can comply with the first to sixth embodiments. The plasma processing apparatus 1 includes a first balun 103, a second balun 303, a vacuum container 110, a first electrode 105a and a second electrode 105b constituting the first pair, and a first electrode 141 and a second electrode 145 constituting the second pair. Alternatively, it may be understood that the plasma processing apparatus 1 includes the first balun 103, the second balun 303, and a main body 10, and the main body 10 includes the vacuum container 110, the first electrode 105a and the second electrode 105b constituting the first pair, and the first electrode 141 and the second electrode 145 constituting the second pair. The main body 10 includes a first terminal 251, a second terminal 252, a third terminal 451 and a fourth terminal 452.

The first balun 103 includes a first unbalanced terminal 201, a second unbalanced terminal 202, a first balanced terminal 211, and a second balanced terminal 212. An unbalanced circuit is connected to the first unbalanced terminal 201 and the second unbalanced terminal 202 of the first balun 103, and a balanced circuit is connected to the first balanced terminal 211 and the second balanced terminal 212 of the first balun 103. The second balun 303 can have an arrangement similar to that of the first balun 103. The second balun 303 includes a first unbalanced terminal 401, a second unbalanced terminal 402, a first balanced terminal 411, and a second balanced terminal 412. An unbalanced circuit is connected to the first unbalanced terminal 401 and the second unbalanced terminal 402 of the second balun 303, and a balanced circuit is connected to the first balanced terminal 411 and the second balanced terminal 412 of the second balun 303. The vacuum container 110 is grounded.

The first electrode 105a of the first pair holds a first target 109a, and opposes a space on the side of the substrate 112 via the first target 109a. The second electrode 105b of the first pair is arranged adjacent to the first electrode 105a, holds a second target 109b, and opposes the space on the side of the substrate 112 via the second target 109b. Each of the targets 109a and 109b can be, for example, an insulator material or a conductor material. The first electrode 105a of the first pair is electrically connected to the first balanced terminal 211 of the first balun 103, and the second electrode 105b of the first pair is electrically connected to the second balanced terminal 212 of the first balun 103.

The first electrode 141 of the second pair holds the substrate 112. The second electrode 145 of the second pair is arranged around the first electrode 141. The first electrode 141 of the second pair is electrically connected to the first balanced terminal 411 of the second balun 303, and the second electrode 145 of the second pair is electrically connected to the second balanced terminal 412 of the second balun 303.

The above arrangement can be understood as an arrangement in which the first electrode 105a of the first pair is electrically connected to the first terminal 251, the second electrode 105b of the first pair is electrically connected to the second terminal 252, the first terminal 251 is electrically connected to the first balanced terminal 211 of the first balun 103, and the second terminal 252 is connected to the second balanced terminal 212 of the first balun 103. Furthermore, the above arrangement can be understood as an arrangement in which the first electrode 141 of the second pair is electrically connected to the third terminal 451, the second electrode 145 of the second pair is electrically connected to the fourth terminal 452, the third terminal 451 is electrically connected to the first balanced terminal 411 of the second balun 303, and the fourth terminal 452 is connected to the second balanced terminal 412 of the second balun 303.

The first electrode 105a of the first pair and the first balanced terminal 211 (first terminal 251) of the first balun 103 can electrically be connected via a blocking capacitor 104a. The blocking capacitor 104a blocks a DC current between the first balanced terminal 211 of the first balun 103 and the first electrode 105a of the first pair (or between the first balanced terminal 211 and the second balanced terminal 212 of the first balun 103). The second electrode 105b of the first pair and the second balanced terminal 212 (second terminal 252) of the first balun 103 can electrically be connected via a blocking capacitor 104b. The blocking capacitor 104b blocks a DC current between the second balanced terminal 212 of the first balun 103 and the second electrode 105b of the first pair (or between the first balanced terminal 211 and the second balanced terminal 212 of the first balun 103). The first electrode 105a and the second electrode 105b of the first pair can be supported by the vacuum container 110 via insulators 132a and 132b, respectively.

The first electrode 141 of the second pair and the first balanced terminal 411 (third terminal 451) of the second balun 303 can electrically be connected via a blocking capacitor 304. The blocking capacitor 304 blocks a DC current between the first balanced terminal 411 of the second balun 303 and the first electrode 141 of the second pair (or between the first balanced terminal 411 and the second balanced terminal 412 of the second balun 303). Instead of providing the blocking capacitor 304, a second impedance matching circuit 302 may be configured to block a DC current flowing between the first unbalanced terminal 401 and the second unbalanced terminal 402 of the second balun 303. The first electrode 141 and the second electrode 145 of the second pair can be supported by the vacuum container 110 via insulators 142 and 146, respectively.

The plasma processing apparatus 1 can include a first high-frequency power supply 101, and a first impedance matching circuit 102 arranged between the first high-frequency power supply 101 and the first balun 103. The first high-frequency power supply 101 supplies a high frequency between the first electrode 105a and the second electrode 105b via the first impedance matching circuit 102, the first balun 103, and the blocking capacitors 104a and 104b. Alternatively, the first high-frequency power supply 101 supplies a high frequency between the first terminal 251 and the second terminal 252 of the main body 10 via the first impedance matching circuit 102 and the first balun 103. The first balun 103 and the first electrode 105a and the second electrode 105b of the first pair form the first high-frequency supply unit that supplies a high frequency to the internal space of the vacuum container 110.

The plasma processing apparatus 1 can include a second high-frequency power supply 301, and the second impedance matching circuit 302 arranged between the second high-frequency power supply 301 and the second balun 303. The second high-frequency power supply 301 supplies a high frequency between the first unbalanced terminal 401 and the second unbalanced terminal 402 of the second balun 303 via the second impedance matching circuit 302. The second high-frequency power supply 301 supplies a high frequency between the first electrode 141 and the second electrode 145 of the second pair via the second impedance matching circuit 302, the second balun 303, and the blocking capacitor 304. Alternatively, the second high-frequency power supply 301 supplies a high frequency between the third terminal 451 and the fourth terminal 452 of the main body 10 via the second impedance matching circuit 302 and the second balun 303. The second balun 303 and the first electrode 141 and the second electrode 145 of the second pair form the second high-frequency supply unit that supplies a high frequency to the internal space of the vacuum container 110.

Let $Rp1-jXp1$ be an impedance when viewing the side of the first electrode 105a and the second electrode 105b of the first pair (the side of the main body 10) from the side of the first balanced terminal 211 and the second balanced terminal 212 of the first balun 103 in a state in which plasma is generated in the internal space of the vacuum container 110 by supplying a high frequency from the first high-frequency power supply 101. Let X1 be the reactance component (inductance component) of the impedance of a first coil 221 of the first balun 103. In this definition, satisfying $1.5 \leq X1/Rp1 \leq 5000$ is advantageous in stabilizing the potential of the plasma formed in the internal space of the vacuum container 110.

In addition, let $Rp2-jXp2$ be an impedance when viewing the side of a first electrode 127 and a second electrode 130 of the second pair (the side of the main body 10) from the side of the first balanced terminal 411 and the second balanced terminal 412 of the second balun 303 in a state in which plasma is generated in the internal space of the vacuum container 110 by supplying a high frequency from the second high-frequency power supply 301. Let X2 be the reactance component (inductance component) of the impedance of a first coil 221 of the second balun 303. In this definition, satisfying $1.5 \leq X2/Rp2 \leq 5000$ is advantageous in stabilizing the potential of the plasma formed in the internal space of the vacuum container 110.

The plasma processing apparatus 1 according to the seventh embodiment can further include at least one of a mechanism for vertically moving the first electrode 141 constituting the second pair and a mechanism for rotating the first electrode 141 constituting the second pair. In the example shown in FIG. 13, the plasma processing apparatus 1 includes a driving mechanism 114 having both the mechanism for vertically moving the first electrode 141 and the mechanism for rotating the first electrode 141. Furthermore, in the example shown in FIG. 13, the plasma processing apparatus 1 includes a mechanism 314 for vertically moving the second electrode 145 constituting the second pair. Bellows forming vacuum partitions can be provided between the vacuum container 110 and the driving mechanisms 114 and 314.

The function of the first balun 103 in the plasma processing apparatus 1 according to the seventh embodiment shown in FIG. 13 will be described with reference to FIG. 14. Let I1 be a current flowing through the first unbalanced terminal 201, I2 be a current flowing through the first balanced terminal 211, I2' be a current flowing through the second unbalanced terminal 202, and I3 be a current, of the current I2, flowing to ground. When I3=0, that is, no current flows to ground on the balanced circuit side, the isolation performance of the balanced circuit with respect to ground is highest. When I3=I2, that is, all the current I2 flowing through the first balanced terminal 211 flows to ground, the isolation performance of the balanced circuit with respect to ground is lowest. Similar to the first to fifth embodiments, an index ISO representing the degree of the isolation performance is given by an equation below. Under this definition, as the absolute value of the index ISO is larger, the isolation performance is higher.

$$ISO[dB]=20 \log(I3/I2')$$

Figure 14:
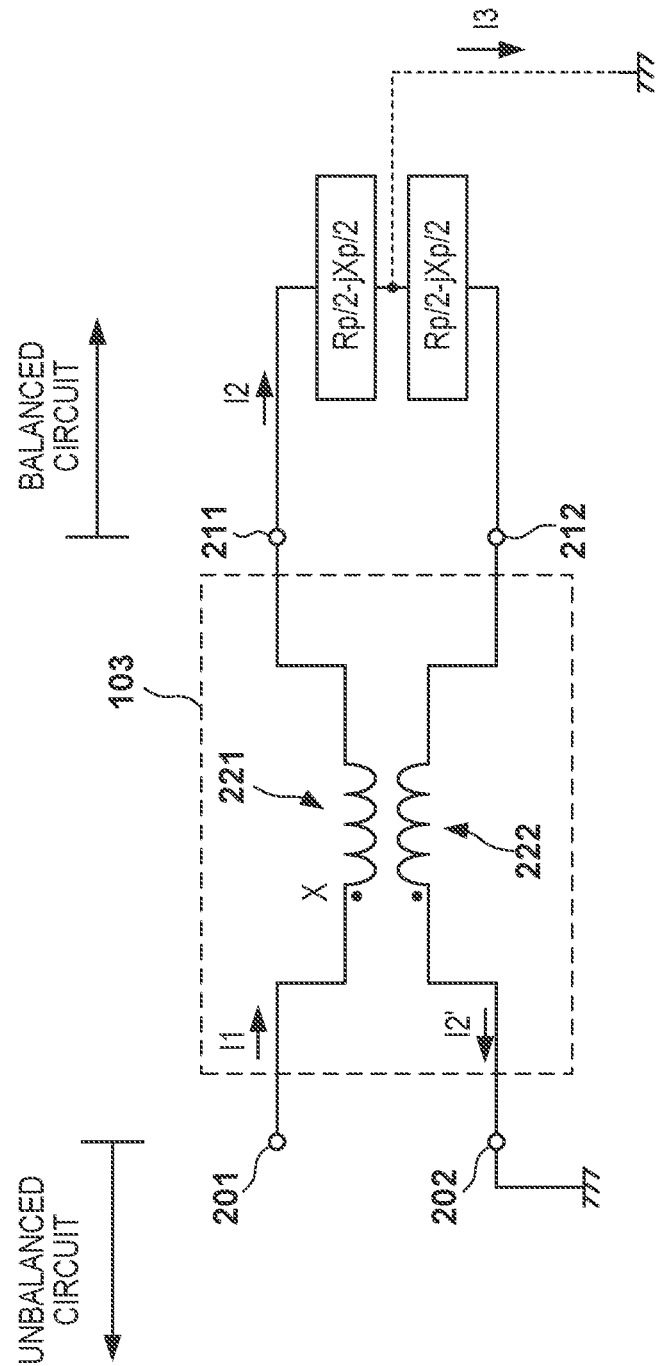
FIG. 14 is a circuit diagram for explaining the function of a balun according to the sixth embodiment of the present invention.

In FIG. 14, $Rp-jXp$ (=$Rp/2-jXp/2+Rp/2-jXp/2$) represents an impedance (including the reactances of the blocking capacitors 104a and 104b) when viewing the side of the first electrode 105a and the second electrode 105b (the side of the main body 10) from the side of the first balanced terminal 211 and the second balanced terminal 212 in a state in which plasma is generated in the internal space of the vacuum container 110. Rp represents a resistance component, and −Xp represents a reactance component. Furthermore, in FIG. 14, X represents the reactance component (inductance component) of the impedance of the first coil 221 of the balun 103. ISO has a correlation with X/Rp.

FIG. 4 referred to in the description of the first embodiment exemplifies the relationship among the currents I1 (=I2), I2', and I3, ISO, and α(=X/Rp). The relationship shown in FIG. 4 also holds in the seventh embodiment. The present inventor found that in the seventh embodiment as well, satisfying 1.5≤X/Rp≤5000 is advantageous in making the potential (plasma potential) of plasma formed in the internal space (the space between the first electrode 105a and the second electrode 105b) of the vacuum container 110 insensitive to the state of the inner surface of the vacuum container 110. When the plasma potential is insensitive to the state of the inner surface of the vacuum container 110, this indicates that it is possible to stabilize the plasma potential even if the plasma processing apparatus 1 is used for a long period. 1.5≤X/Rp≤5000 corresponds to −10.0 dB≥ISO≥−80 dB.

Figure 15A:
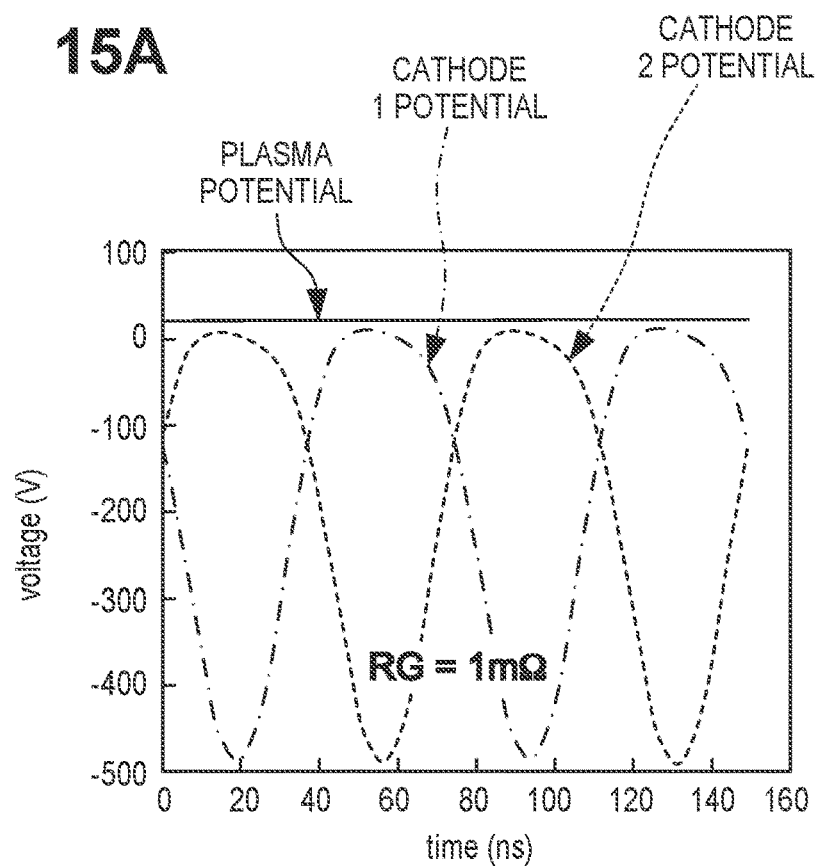
FIG. 15A is a timing chart showing a result of simulating a plasma potential and two cathode potentials when $1.5 \leq X/Rp \leq 5000$ is satisfied.
Figure 15B:
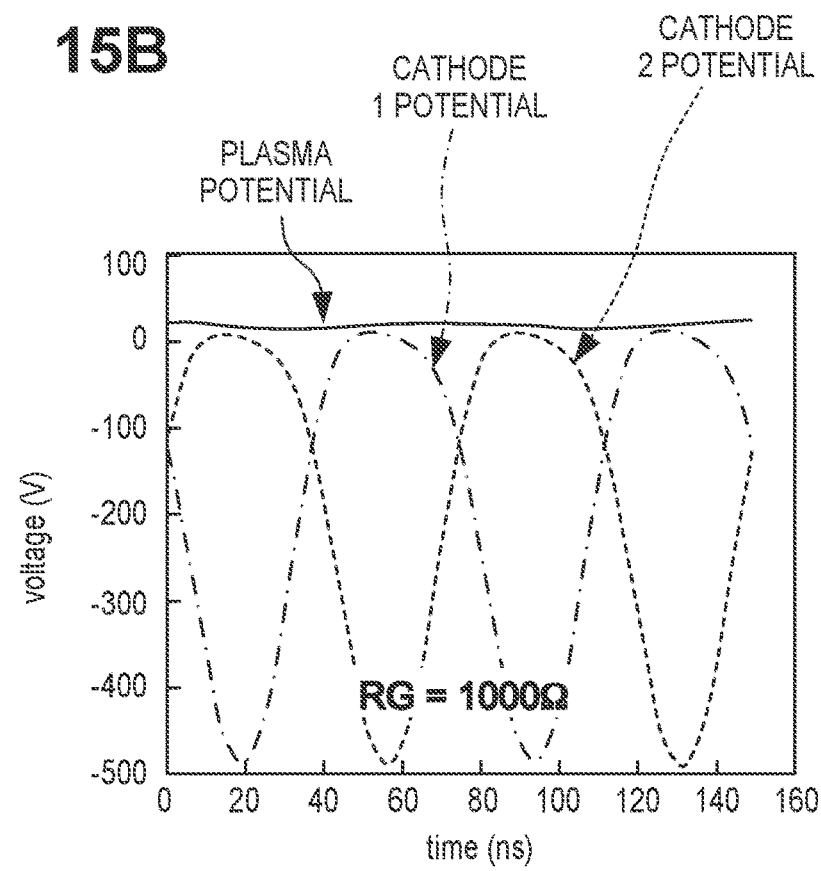
FIG. 15B is a timing chart showing a result of simulating a plasma potential and two cathode potentials when $1.5 \leq X/Rp \leq 5000$ is satisfied.

FIGS. 15A to 15D each show the plasma potential, the potential (cathode 1 potential) of the first electrode 105a, and the potential (cathode 2 potential) of the second electrode 105b when 1.5≤X/Rp≤5000 is satisfied. FIG. 15A shows the plasma potential, the potential (cathode 1 potential) of the first electrode 105a, and the potential (cathode 2 potential) of the second electrode 105b in a state in which a resistive film (1 mΩ) is formed on the inner surface of the vacuum container 110. FIG. 15B shows the plasma potential, the potential (cathode 1 potential) of the first electrode 105a, and the potential (cathode 2 potential) of the second electrode 105b in a state in which a resistive film (1,000Ω) is formed on the inner surface of the vacuum container 110. FIG. 15C shows the plasma potential, the potential (cathode 1 potential) of the first electrode 105a, and the potential (cathode 2 potential) of the second electrode 105b in a state in which an inductive film (0.6 pH) is formed on the inner surface of the vacuum container 110. FIG. 15D shows the plasma potential, the potential (cathode 1 potential) of the first electrode 105a, and the potential (cathode 2 potential) of the second electrode 105b in a state in which a capacitive film (0.1 nF) is formed on the inner surface of the vacuum container 110. With reference to FIGS. 15A to 15D, it is understood that satisfying 1.5≤X/Rp≤5000 is advantageous in stabilizing the plasma potential in various states of the inner surface of the vacuum container 110.

Figure 16A:
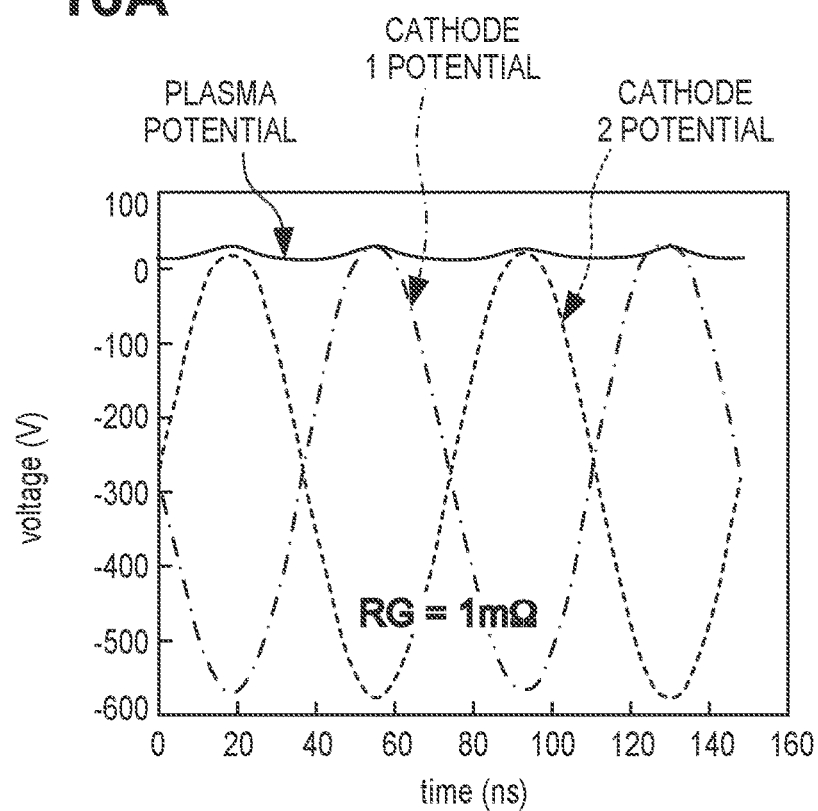
FIG. 16A is a timing chart showing a result of simulating a plasma potential and two cathode potentials when $1.5 \leq X/Rp \leq 5000$ is not satisfied.
Figure 16B:
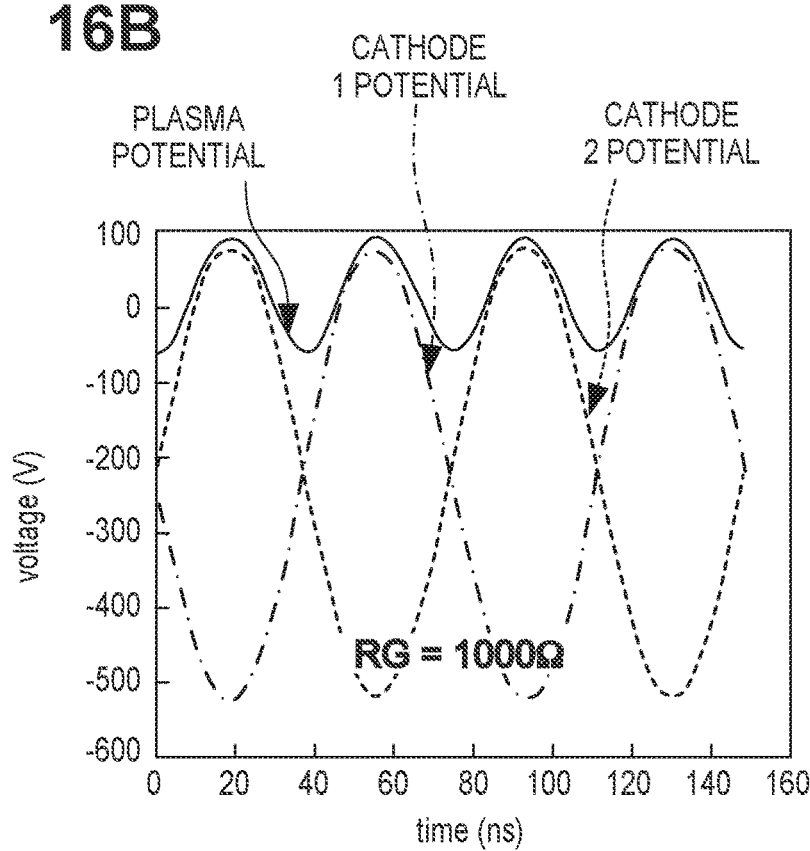
FIG. 16B is a timing chart showing a result of simulating a plasma potential and two cathode potentials when $1.5 \leq X/Rp \leq 5000$ is not satisfied.
Figure 16C:
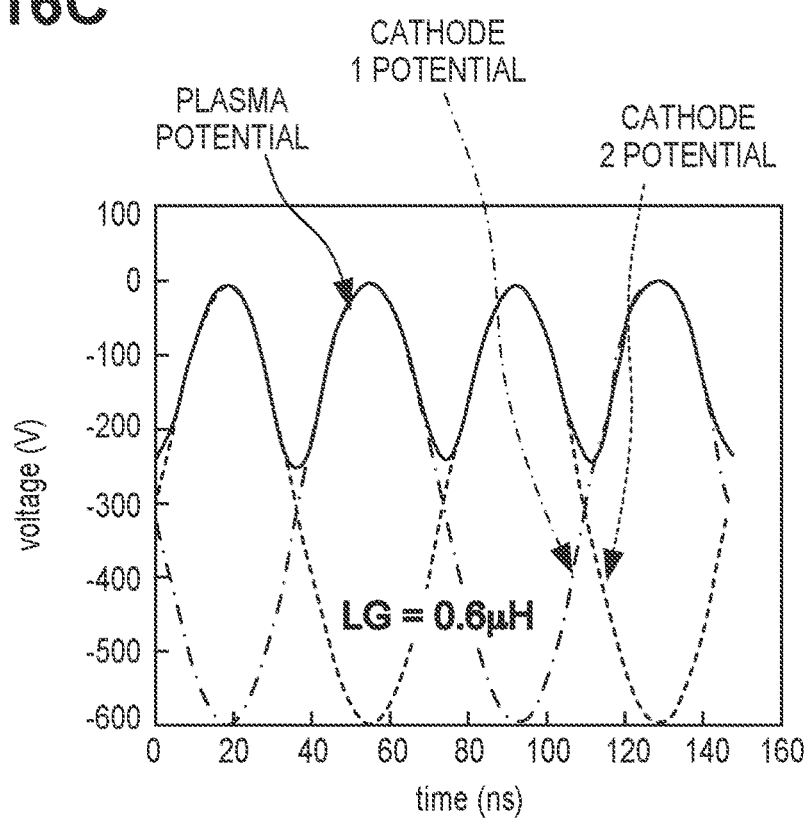
FIG. 16C is a timing chart showing a result of simulating a plasma potential and two cathode potentials when $1.5 \leq X/Rp \leq 5000$ is not satisfied.
Figure 16D:
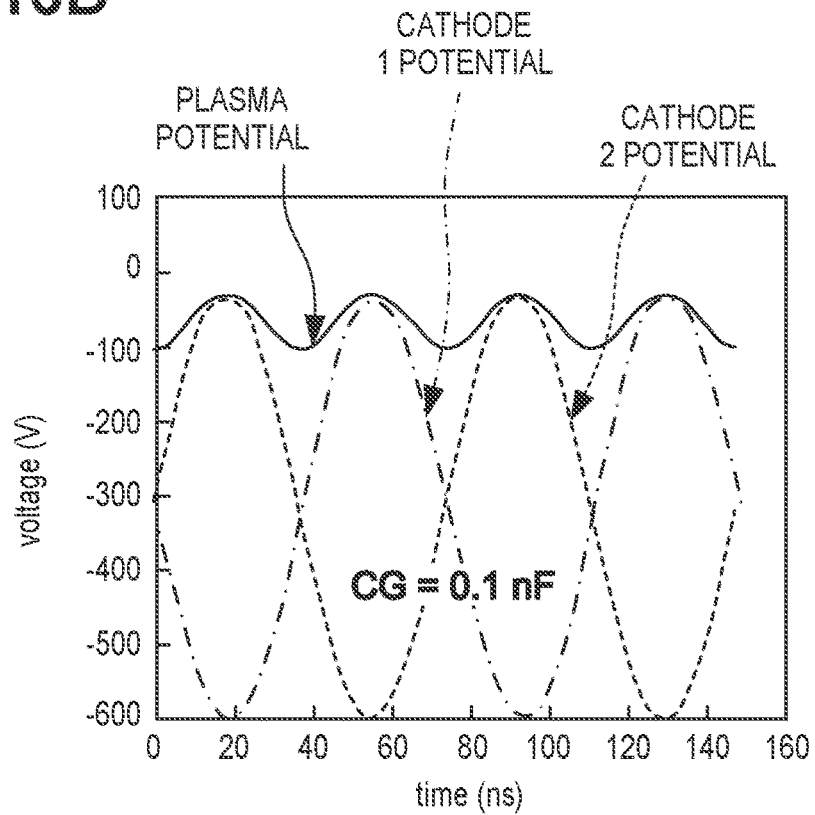
FIG. 16D is a timing chart showing a result of simulating a plasma potential and two cathode potentials when $1.5 \leq X/Rp \leq 5000$ is not satisfied.

FIGS. 16A to 16D each show a result of simulating the plasma potential, the potential (cathode 1 potential) of the first electrode 105a, and the potential (cathode 2 potential) of the second electrode 105b when 1.5≤X/Rp≤5000 is not satisfied. FIG. 16A shows the plasma potential, the potential (cathode 1 potential) of the first electrode 105a, and the potential (cathode 2 potential) of the second electrode 105b in a state in which a resistive film (1 mΩ) is formed on the inner surface of the vacuum container 110. FIG. 16B shows the plasma potential, the potential (cathode 1 potential) of the first electrode 105a, and the potential (cathode 2 potential) of the second electrode 105b in a state in which a resistive film (1,000Ω) is formed on the inner surface of the vacuum container 110. FIG. 16C shows the plasma potential, the potential (cathode 1 potential) of the first electrode 105a, and the potential (cathode 2 potential) of the second electrode 105b in a state in which an inductive film (0.6 pH) is formed on the inner surface of the vacuum container 110. FIG. 16D shows the plasma potential, the potential (cathode 1 potential) of the first electrode 105a, and the potential (cathode 2 potential) of the second electrode 105b in a state in which a capacitive film (0.1 nF) is formed on the inner surface of the vacuum container 110. With reference to FIGS. 16A to 16D, it is understood that when 1.5≤X/Rp≤5000 is not satisfied, the plasma potential changes depending on the state of the inner surface of the vacuum container 110.

In both the case in which X/Rp>5000 (for example, X/Rp=∞) is satisfied and the case in which X/Rp<1.5 (for example, X/Rp=1.16 or X/Rp=0.87) is satisfied, the plasma potential readily changes depending on the state of the inner surface of the vacuum container 110. If X/Rp>5000 is satisfied, in a state in which no film is formed on the inner surface of the vacuum container 110, discharge occurs only between the first electrode 105a and the second electrode 105b. However, if X/Rp>5000 is satisfied, when a film starts to be formed on the inner surface of the vacuum container 110, the plasma potential sensitively reacts to this, and the results exemplified in FIGS. 16A to 16D are obtained. On the other hand, when X/Rp<1.5 is satisfied, a current flowing to ground via the vacuum container 110 is large. Therefore, the influence of the state of the inner surface of the vacuum container 110 (the electrical characteristic of a film formed on the inner surface) is conspicuous, and the plasma potential changes depending on formation of a film. Thus, as described above, the plasma processing apparatus 1 is advantageously configured to satisfy 1.5≤X/Rp≤5000.

Figure 17:
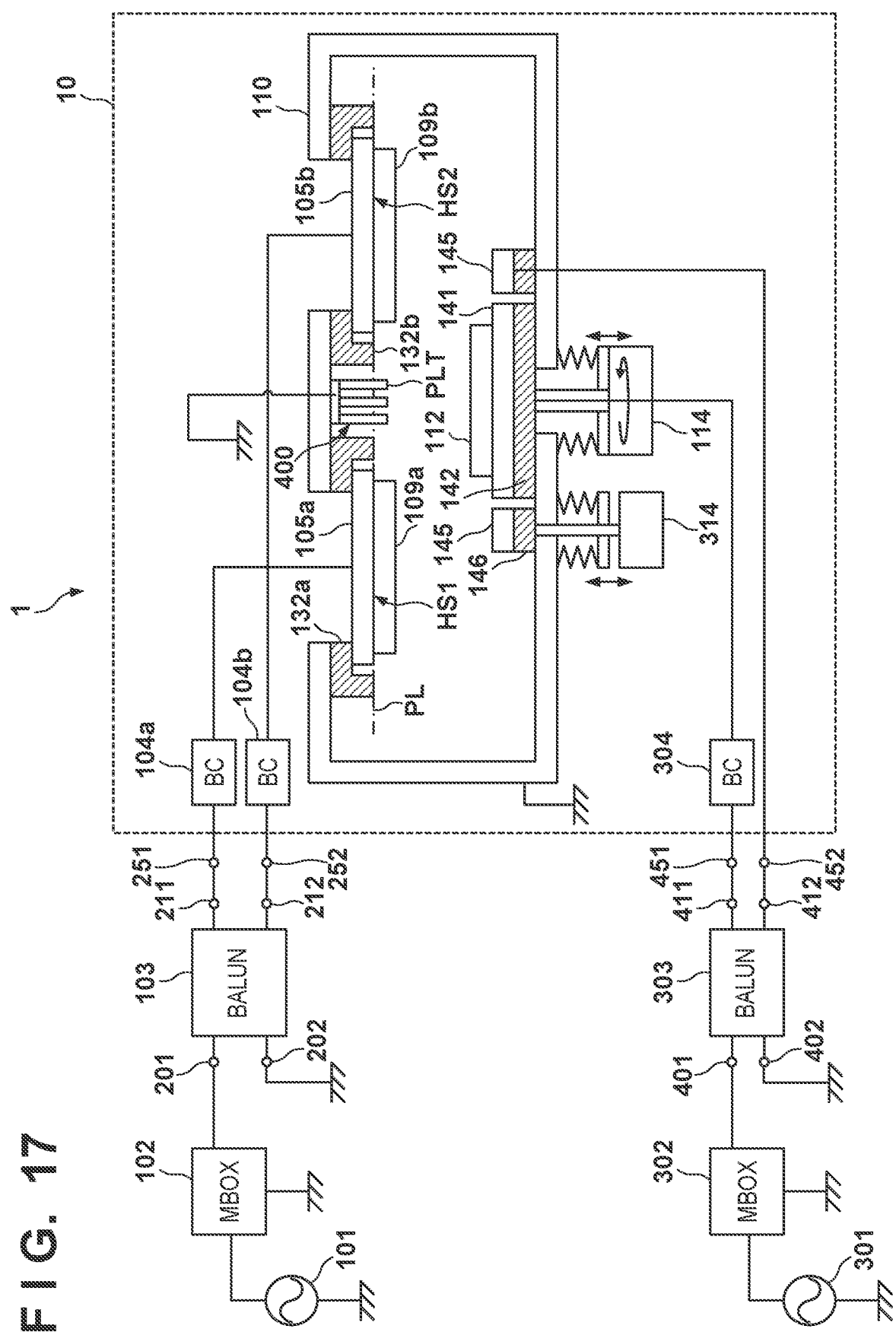
FIG. 17 is a circuit diagram schematically showing the arrangement of a plasma processing apparatus 1 according to the eighth embodiment of the present invention.

FIG. 17 schematically shows the arrangement of a plasma processing apparatus 1 according to the eighth embodiment of the present invention. The plasma processing apparatus according to the eighth embodiment can operate as a sputtering apparatus that forms a film on a substrate 112 by sputtering. Items which are not referred to as the plasma processing apparatus 1 according to the eighth embodiment can comply with the first to seventh embodiments. The plasma processing apparatus 1 according to the eighth embodiment includes a balun (first balun) 103, a vacuum container 110, a first electrode 105a, a second electrode 105b, and a ground electrode 400. Alternatively, it may be understood that the plasma processing apparatus 1 includes the balun 103 and a main body 10, and the main body 10 includes the vacuum container 110, the first electrode 105a, the second electrode 105b, and the ground electrode 400. The main body 10 includes a first terminal 251 and a second terminal 252.

The ground electrode 400 is arranged in the vacuum container 110, and grounded. The ground electrode 400 can include a plurality of plate portions PLT arranged to be parallel to each other. The plurality of plate portions PLT can be arranged so that the ground electrode 400 has a comb-tooth shape in one section (for example, a section along the vertical direction). From another viewpoint, the ground electrode 400 can have a comb-tooth shape in one section (for example, a section along the vertical direction). This arrangement of the ground electrode 400 can contribute to an increase in area of a portion functioning as an anode. Furthermore, this arrangement of the ground electrode 400 is advantageous in suppressing formation of a film on the ground electrode 400 when forming a film on the substrate 112.

The first electrode 105a can include a first holding surface HS1 that holds a first target 109a as the first member, and the second electrode 105b can include a second holding surface HS2 that holds a second target 109b as the second member. The first holding surface HS1 and the second holding surface HS2 can belong to one plane PL. The ground electrode 400 can be arranged to intersect the plane PL. The ground electrode 400 can include, for example, a portion arranged between the first electrode 105a and the second electrode 105b. The ground electrode 400 can include, for example, a portion arranged between the first target 109a as the first member and the second target 109b as the second member. The ground electrode 400 is advantageous in suppressing formation of a film on the ground electrode 400 when forming a film on the substrate 112.

The plasma processing apparatus 1 according to the eighth embodiment may further include a second balun 303, a third electrode 141, and a fourth electrode 145. In other words, the plasma processing apparatus 1 can include the first balun 103, the second balun 303, the vacuum container 110, the first electrode 105a, the second electrode 105b, the third electrode 141, and the fourth electrode 145. Alternatively, it may be understood that the plasma processing apparatus 1 includes the first balun 103, the second balun 303, and the main body 10, and the main body 10 includes the vacuum container 110, the first electrode 105a, the second electrode 105b, the third electrode 141, and the fourth electrode 145. The third electrode 141 and the fourth electrode 145 are arranged to oppose the plane PL. The main body 10 includes the first terminal 251, the second terminal 252, a third terminal 451, and a fourth terminal 452.

The first balun 103 includes a first unbalanced terminal 201, a second unbalanced terminal 202, a first balanced terminal 211, and a second balanced terminal 212. An unbalanced circuit is connected to the first unbalanced terminal 201 and the second unbalanced terminal 202 of the first balun 103, and a balanced circuit is connected to the first balanced terminal 211 and the second balanced terminal 212 of the first balun 103. The second balun 303 can have an arrangement similar to that of the first balun 103. The second balun 303 includes a third unbalanced terminal 401, a fourth unbalanced terminal 402, a third balanced terminal 411, and a fourth balanced terminal 412. An unbalanced circuit is connected to the third unbalanced terminal 401 and the fourth unbalanced terminal 402 of the second balun 303, and a balanced circuit is connected to the third balanced terminal 411 and the fourth balanced terminal 412 of the second balun 303. The vacuum container 110 is grounded. Each of the baluns 103 and 303 can have the arrangement shown in FIG. 2A or 2B (FIG. 14).

The first electrode 105a holds the first target 109a, and opposes a space on the side of the substrate 112 as a processing target via the first target 109a. The second electrode 105b is arranged adjacent to the first electrode 105a, holds the second target 109b, and opposes the space on the side of the substrate 112 as a processing target via the second target 109b. Each of the targets 109a and 109b can be, for example, an insulator material or a conductor material. The first electrode 105a is electrically connected to the first balanced terminal 211 of the first balun 103, and the second electrode 105b is electrically connected to the second balanced terminal 212 of the first balun 103.

The third electrode 141 holds the substrate 112. The fourth electrode 145 can be arranged around the third electrode 141. The third electrode 141 is electrically connected to the first balanced terminal 411 of the second balun 303, and the fourth electrode 145 is electrically connected to the second balanced terminal 412 of the second balun 303.

The above arrangement can be understood as an arrangement in which the first electrode 105a is electrically connected to the first terminal 251, the second electrode 105b is electrically connected to the second terminal 252, the first terminal 251 is electrically connected to the first balanced terminal 211 of the first balun 103, and the second terminal 252 is connected to the second balanced terminal 212 of the first balun 103. The above arrangement can be understood as an arrangement in which the third electrode 141 is electrically connected to the third terminal 451, the fourth electrode 145 is electrically connected to the fourth terminal 452, the third terminal 451 is electrically connected to the first balanced terminal 411 of the second balun 303, and the fourth terminal 452 is connected to the second balanced terminal 412 of the second balun 303.

The first electrode 105a and the first balanced terminal 211 (first terminal 251) of the first balun 103 can electrically be connected via a blocking capacitor 104a. The blocking capacitor 104a blocks a DC current between the first balanced terminal 211 of the first balun 103 and the first electrode 105a (or between the first balanced terminal 211 and the second balanced terminal 212 of the first balun 103). The second electrode 105b and the second balanced terminal 212 (second terminal 252) of the first balun 103 can electrically be connected via a blocking capacitor 104b. The blocking capacitor 104b blocks a DC current between the second balanced terminal 212 of the first balun 103 and the second electrode 105b (or between the first balanced terminal 211 and the second balanced terminal 212 of the first balun 103). The first electrode 105a and the second electrode 105b can be supported by the vacuum container 110 via insulators 132a and 132b, respectively.

The third electrode 141 and the first balanced terminal 411 (third terminal 451) of the second balun 303 can electrically be connected via a blocking capacitor 304. The blocking capacitor 304 blocks a DC current between the first balanced terminal 411 of the second balun 303 and the third electrode 141 (or between the first balanced terminal 411 and the second balanced terminal 412 of the second balun 303). Instead of providing the blocking capacitor 304, a second impedance matching circuit 302 may be configured to block a DC current flowing between the first unbalanced terminal 401 and the second unbalanced terminal 402 of the second balun 303. The third electrode 141 and the fourth electrode 145 can be supported by the vacuum container 110 via insulators 142 and 146, respectively.

The plasma processing apparatus 1 can include a first high-frequency power supply 101, and a first impedance matching circuit 102 arranged between the first high-frequency power supply 101 and the first balun 103. The first high-frequency power supply 101 supplies a high frequency between the first electrode 105a and the second electrode 105b via the first impedance matching circuit 102, the first balun 103, and the blocking capacitors 104a and 104b. Alternatively, the first high-frequency power supply 101 supplies a high frequency between the first terminal 251 and the second terminal 252 of the main body 10 via the first impedance matching circuit 102 and the first balun 103. The first balun 103, the first electrode 105a, and the second electrode 105b form the first high-frequency supply unit that supplies a high frequency to the internal space of the vacuum container 110.

The plasma processing apparatus 1 can include a second high-frequency power supply 301, and the second impedance matching circuit 302 arranged between the second high-frequency power supply 301 and the second balun 303. The second high-frequency power supply 301 supplies a high frequency between the first unbalanced terminal 401 and the second unbalanced terminal 402 of the second balun 303 via the second impedance matching circuit 302. The second high-frequency power supply 301 supplies a high frequency between the third electrode 141 and the fourth electrode 145 via the second impedance matching circuit 302, the second balun 303, and the blocking capacitor 304. Alternatively, the second high-frequency power supply 301 supplies a high frequency between the third terminal 451 and the fourth terminal 452 of the main body 10 via the second impedance matching circuit 302 and the second balun 303. The second balun 303, the third electrode 141, and the fourth electrode 145 form the second high-frequency supply unit that supplies a high frequency to the internal space of the vacuum container 110.

Let $Rp1-jXp1$ be an impedance when viewing the side of the first electrode 105a and the second electrode 105b (the side of the main body 10) from the side of the first balanced terminal 211 and the second balanced terminal 212 of the first balun 103 in a state in which plasma is generated in the internal space of the vacuum container 110 by supplying a high frequency from the first high-frequency power supply 101. Let X1 be the reactance component (inductance component) of the impedance of a first coil 221 of the first balun 103. In this definition, satisfying $1.5 \leq X1/Rp1 \leq 5000$ is advantageous in stabilizing the potential of the plasma formed in the internal space of the vacuum container 110. Note that satisfying the condition of $1.5 \leq X/Rp1 \leq 5000$ is not essential to the eighth embodiment and is an advantageous condition. In the eighth embodiment, even if the condition of $1.5 \leq X/Rp1 \leq 5000$ is not satisfied, it is possible to obtain the effect of making the potential (plasma potential) of the plasma formed in the internal space (the space between the first electrode 106 and the second electrode 111) of the vacuum container 110 insensitive to the state of the inner surface of the vacuum container 110 by providing the ground electrode 400 in the vacuum container 110.

In addition, let $Rp2-jXp2$ be an impedance when viewing the side of the third electrode 141 and the fourth electrode 145 (the side of the main body 10) from the side of the first balanced terminal 411 and the second balanced terminal 412 of the second balun 303 in a state in which plasma is generated in the internal space of the vacuum container 110 by supplying a high frequency from the second high-frequency power supply 301. Let X2 be the reactance component (inductance component) of the impedance of the first coil 221 of the second balun 303. In this definition, satisfying $1.5 \leq X2/Rp2 \leq 5000$ is advantageous in stabilizing the potential of the plasma formed in the internal space of the vacuum container 110. Note that satisfying the condition of $1.5 \leq X/Rp2 \leq 5000$ is not essential to the eighth embodiment and is an advantageous condition. In the eighth embodiment, even if the condition of $1.5 \leq X/Rp2 \leq 5000$ is not satisfied, it is possible to obtain the effect of making the potential (plasma potential) of the plasma formed in the internal space (the space between the first electrode 106 and the second electrode 111) of the vacuum container 110 insensitive to the state of the inner surface of the vacuum container 110 by providing the ground electrode 400 in the vacuum container 110.

In addition, according to one embodiment, when Rp' represents a resistance component between the third balanced terminal and the fourth balanced terminal, and X' represents an inductance between the third unbalanced terminal and the third balanced terminal, when viewing a side of the third electrode and the fourth electrode from a side of the third balanced terminal and the fourth balanced terminal, $1.5 \leq X'/Rp' \leq 5000$ is satisfied.

The plasma processing apparatus 1 according to the eighth embodiment can further include at least one of a mechanism for vertically moving the third electrode 141 and a mechanism for rotating the third electrode 141. In the example shown in FIG. 17, the plasma processing apparatus 1 includes a driving mechanism 114 having both the mechanism for vertically moving the third electrode 141 and the mechanism for rotating the third electrode 141. Furthermore, in the example shown in FIG. 17, the plasma processing apparatus 1 includes a mechanism 314 for vertically moving the fourth electrode 145. Bellows forming vacuum partitions can be provided between the vacuum container 110 and the driving mechanisms 114 and 314.

Figure 18:
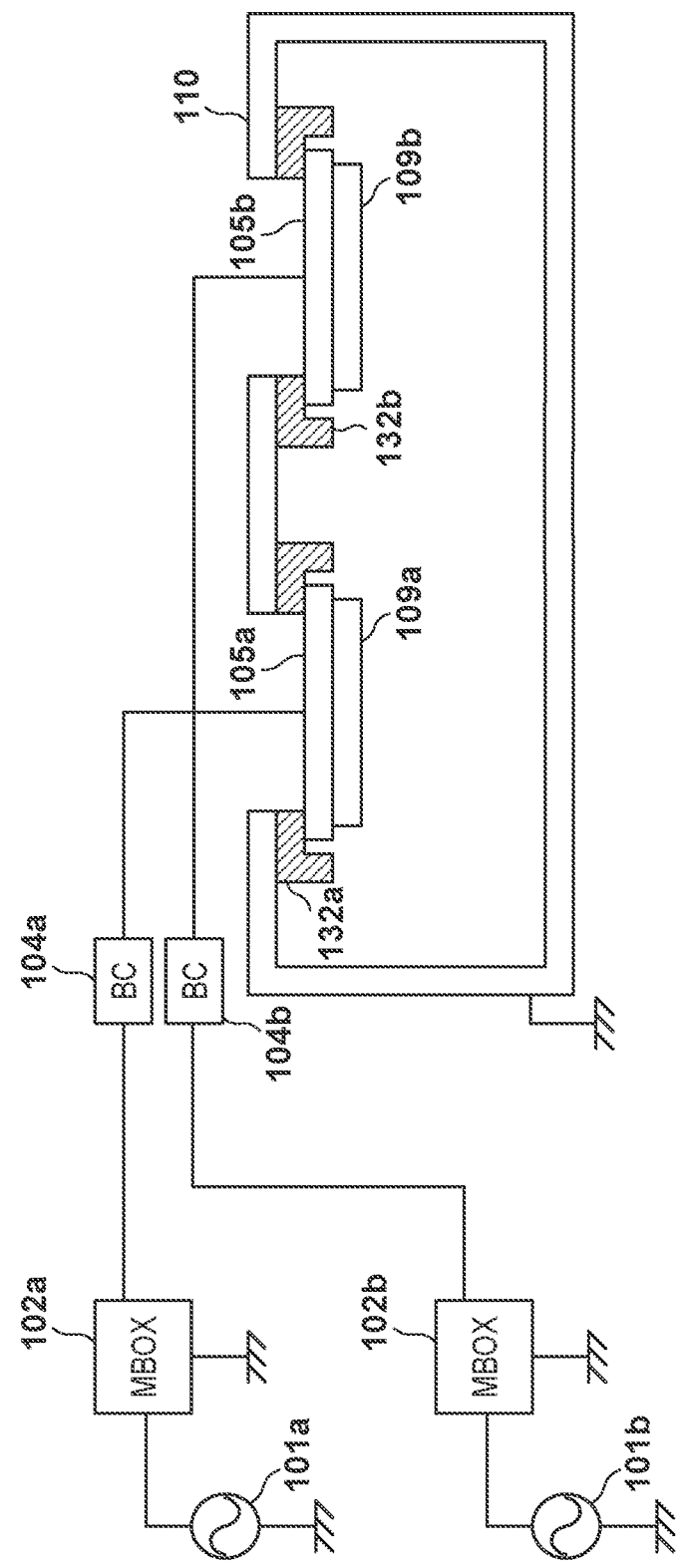
FIG. 18 is a circuit diagram showing the arrangement of a plasma processing apparatus according to a comparative example.
Figure 19:
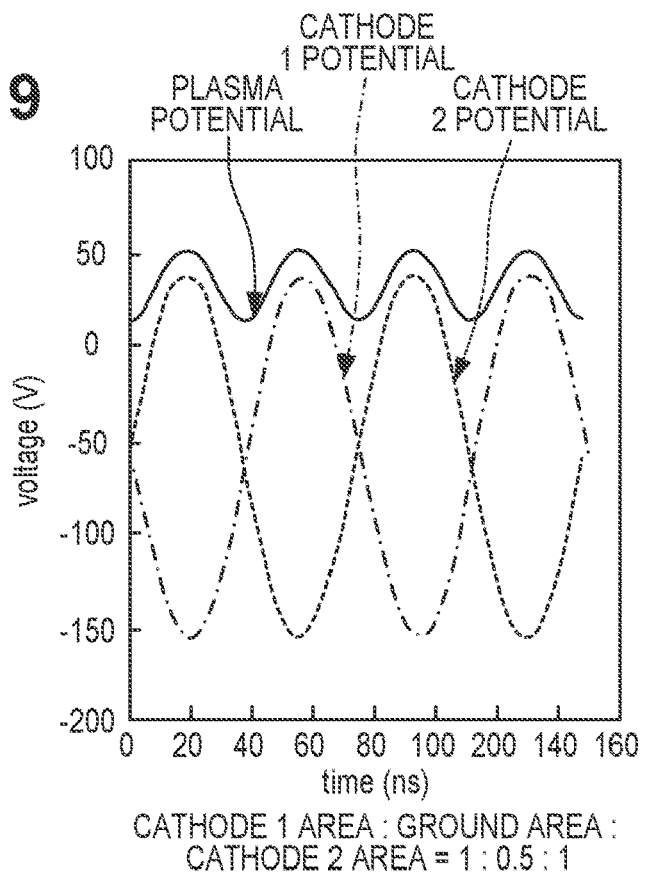
FIG. 19 is a timing chart showing a simulation result of the operation of the plasma processing apparatus according to the comparative example shown in FIG. 18.
Figure 20:
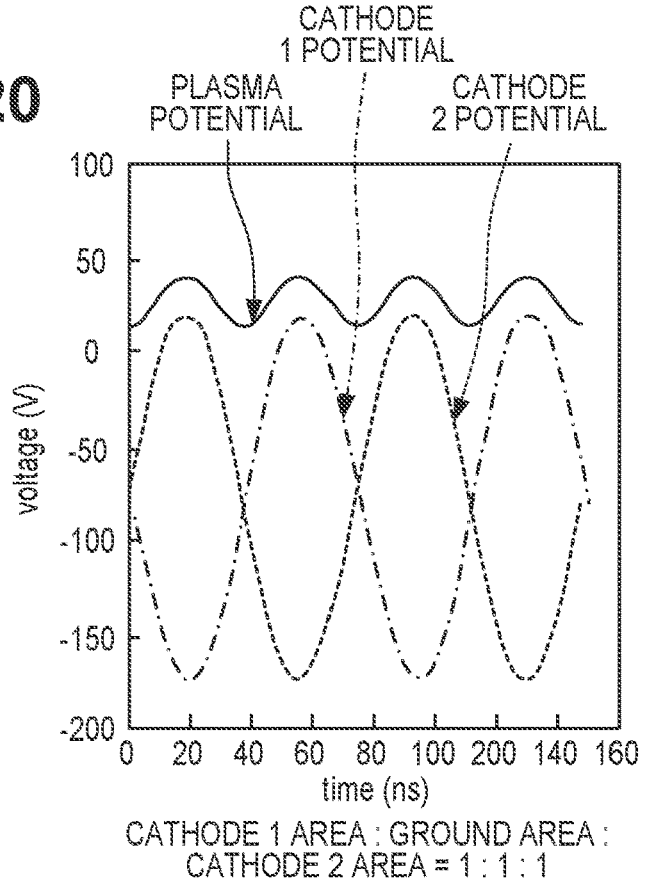
FIG. 20 is a timing chart showing a simulation result of the operation of the plasma processing apparatus according to the comparative example shown in FIG. 18.
Figure 21:
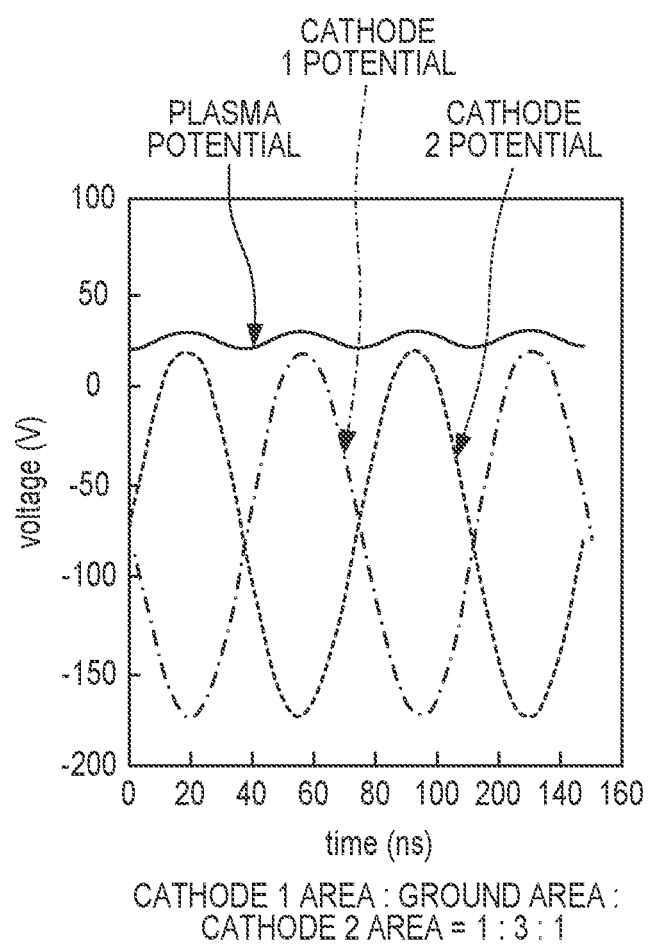
FIG. 21 is a timing chart showing a simulation result of the operation of the plasma processing apparatus according to the comparative example shown in FIG. 18.

A comparative example will be described below with reference to FIGS. 18 to 21. As shown in FIG. 18, a plasma processing apparatus 1' according to the comparative example has a structure obtained by eliminating the baluns 103 and 303 and the ground electrode 400 from the plasma processing apparatus 1 according to the eighth embodiment. Note that in FIG. 18, a third electrode 141 and a fourth electrode 145 are not illustrated. FIGS. 19 to 21 each show a simulation result of a plasma potential, the potential (cathode 1 potential) of a first electrode 105a, and the potential (cathode 2 potential) of a second electrode 105b. In this simulation, high-frequency power supplies 101a and 101b are set to generate a voltage of $100 \sin(\omega t)$ [V]. The radius of each of the first electrode 105a and the second electrode 105b is set to 10 cm. In addition, in FIGS. 19 to 21, [cathode 1 area:ground area:cathode 2 area] represents [the area of the first electrode 105a]:[the area of a portion of the vacuum container 110, which functions as an anode]:[the area of the second electrode 105b].

FIG. 19 shows a simulation result when cathode 1 area: ground area:cathode 2 area is 1:0.5:1. FIG. 20 shows a simulation result when cathode 1 area:ground area:cathode 2 area is 1:1:1. FIG. 21 shows a simulation result when cathode 1 area:ground area:cathode 2 area is 1:3:1. When forming a film on a substrate 112 by sputtering, a film can also be formed on the inner surface of a vacuum container 110. This can change the state of the inner surface of the vacuum container 110, for example, the area (ground area) of the portion of the vacuum container 110, which functions as an anode. With reference to the results shown in FIGS. 19 to 21, the plasma potential can change due to a change in ground area. This indicates that if film formation is continued for a plurality of substrates, the plasma potential can change to change the characteristic for forming a film. Furthermore, the results shown in FIGS. 19 to 21, a larger area (ground area) of the portion of the vacuum container 110, which functions as an anode is more effective in suppressing a change in plasma potential.

On the other hand, according to the eighth embodiment, it is possible to stabilize the potential of the plasma formed in the internal space of the vacuum container 110 by providing the balun 103 and the ground electrode 400 and satisfying the condition of $1.5 \leq X/Rp1 \leq 5000$, as described above. Alternatively, it is possible to stabilize the potential of the plasma formed in the internal space of the vacuum container 110 by providing the baluns 103 and 303 and the ground electrode 400 and satisfying the conditions of $1.5 \leq X/Rp1 \leq 5000$ and $1.5 \leq X/Rp2 \leq 5000$.

Furthermore, according to the eighth embodiment, even if the condition of $1.5 \leq X/Rp1 \leq 5000$ is not satisfied, it is possible to stabilize the potential of the plasma formed in the internal space of the vacuum container 110 by providing the balun 103 and the ground electrode 400. Alternatively, according to the eighth embodiment, even if the conditions of $1.5 \leq X/Rp1 \leq 5000$ and $1.5 \leq X/Rp2 \leq 5000$ are not satisfied, it is possible to stabilize the potential of the plasma formed in the internal space of the vacuum container 110 by providing the balun 103 and the ground electrode 400.

Figure 22:
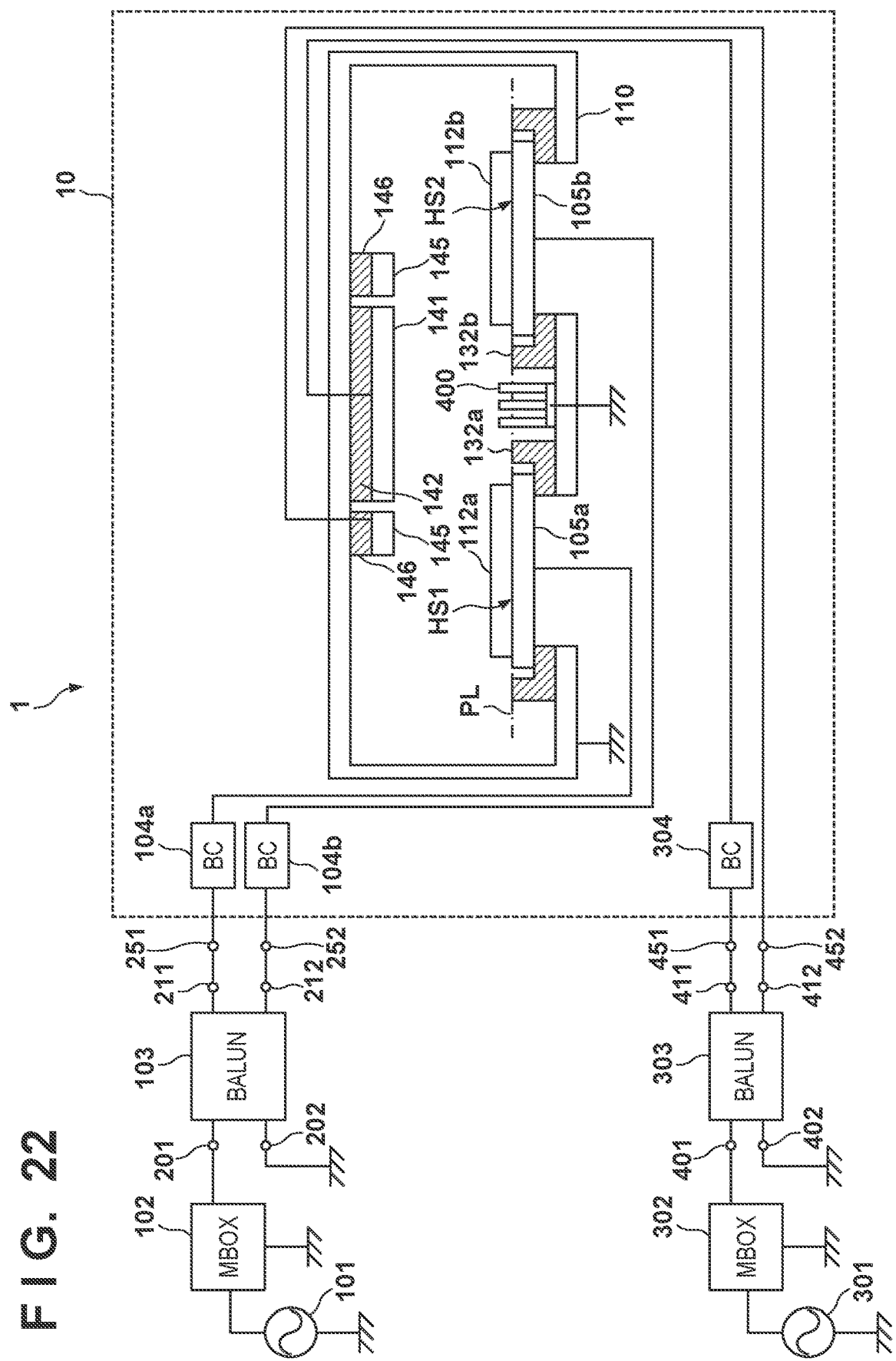
FIG. 22 is a circuit diagram schematically showing the arrangement of a plasma processing apparatus 1 according to the ninth embodiment of the present invention.

FIG. 22 schematically shows the arrangement of a plasma processing apparatus 1 according to the ninth embodiment of the present invention. The plasma processing apparatus 1 according to the ninth embodiment can operate as an etching apparatus that etches substrates 112a and 112b. The plasma processing apparatus 1 according to the ninth embodiment is different from that according to the eighth embodiment in that a first electrode 105*a* and a second electrode 105*b* hold the first substrate 112*a* and the second substrate 112*b* to be etched, respectively, and a third electrode 141 holds no substrate. In terms of the remaining points, the plasma processing apparatus 1 according to the ninth embodiment can have an arrangement similar to that of the plasma processing apparatus 1 according to the eighth embodiment.

The present invention is not limited to the above-described embodiments, and various changes and modifications can be made within the spirit and scope of the present invention. Therefore, to apprise the public of the scope of the present invention, the following claims are made.

The invention claimed is:

1. A plasma processing apparatus comprising:
   A first balun including a first unbalanced terminal, a second unbalanced terminal, a first balanced terminal, and a second balanced terminal;
   a grounded vacuum container;
   a first electrode electrically connected to the first balanced terminal;
   a second electrode electrically connected to the second balanced terminal;
   wherein the first electrode includes a first holding surface configured to hold a first member, the second electrode includes a second holding surface configured to hold a second member, and the first holding surface and the second holding surface belong to one plane,
   a ground electrode arranged in the vacuum container and grounded,
   a second balun including a third unbalanced terminal, a fourth unbalanced terminal, a third balanced terminal, and a fourth balanced terminal;
   a third electrode electrically connected to the third balanced terminal; and
   a fourth electrode electrically connected to the fourth balanced terminal,
   wherein the fourth electrode is arranged around the third electrode, and the third electrode and the fourth electrode are arranged to oppose the one plane,
   wherein Rp' represents a resistance component between the third balanced terminal and the fourth balanced terminal, and X' represents an inductance between the third unbalanced terminal and the third balanced terminal, when viewing a side of the third electrode and the fourth electrode from a side of the third balanced terminal and the fourth balanced terminal, $1.5 \leq X'/Rp' \leq 5000$ is satisfied.

2. The plasma processing apparatus according to claim 1, wherein the ground electrode includes a plurality of plate portions arranged to be parallel to each other.

3. The plasma processing apparatus according to claim 2, wherein the plurality of plate portions are arranged so that the ground electrode has a comb-tooth shape in a section.

4. The plasma processing apparatus according to claim 1, wherein the ground electrode has a comb-tooth shape in a section.

5. The plasma processing apparatus according to claim 1, wherein the ground electrode is arranged to intersect the one plane.

6. The plasma processing apparatus according to claim 5, wherein the ground electrode includes a portion arranged between the first member and the second member.

7. The plasma processing apparatus according to claim 1, wherein the first holding surface opposes an internal space of the vacuum container via the first member, and the second holding surface opposes the internal space of the vacuum container via the second member.

8. The plasma processing apparatus according to claim 1, wherein the first balanced terminal and the first electrode are electrically connected via a blocking capacitor.

9. The plasma processing apparatus according to claim 1, wherein the second balanced terminal and the second electrode are electrically connected via a blocking capacitor.

10. The plasma processing apparatus according to claim 1, wherein the first balanced terminal and the first electrode are electrically connected via a blocking capacitor, and the second balanced terminal and the second electrode are electrically connected via a blocking capacitor.

11. The plasma processing apparatus according to claim 1, wherein the first electrode and the second electrode are supported by the vacuum container via insulators.

12. The plasma processing apparatus according to claim 1, wherein each of the first and second baluns includes a first coil configured to connect the first unbalanced terminal and the first balanced terminal, and a second coil configured to connect the second unbalanced terminal and the second balanced terminal.

13. The plasma processing apparatus according to claim 12, wherein each of the first and second baluns further includes a third coil and a fourth coil both of which are connected between the first balanced terminal and the second balanced terminal, and the third coil and the fourth coil are configured to set, as a midpoint between a voltage of the first balanced terminal and a voltage of the second balanced terminal, a voltage of a connection node of the third coil and the fourth coil.

14. The plasma processing apparatus according to claim 1, wherein the first electrode holds a first target, the second electrode holds a second target, the first electrode opposes a space on a side of a substrate as a processing target via the first target, and the second electrode opposes the space via the second target.

15. The plasma processing apparatus according to claim 1, wherein the first electrode holds a first substrate, the second electrode holds a second substrate, and the plasma processing apparatus is configured as an etching apparatus configured to etch the first substrate and the second substrate.

16. The plasma processing apparatus according to claim 1, further comprising:
   a high-frequency power supply; and
   an impedance matching circuit arranged between the high-frequency power supply and the second balun.

17. The plasma processing apparatus according to claim 1, wherein Rp represents a resistance component between the first balanced terminal and the second balanced terminal, and X represents an inductance between the first unbalanced terminal and the first balanced terminal, when viewing a side of the first electrode and the second electrode from a side of the first balanced terminal and the second balanced terminal, $1.5 \leq X/Rp \leq 5000$ is satisfied.

* * * * *